(12) United States Patent
Cheng et al.

(10) Patent No.: US 9,689,918 B1
(45) Date of Patent: Jun. 27, 2017

(54) TEST ACCESS ARCHITECTURE FOR STACKED MEMORY AND LOGIC DIES

(71) Applicant: Mentor Graphics Corporation, Wilsonville, OR (US)

(72) Inventors: Wu-Tung Cheng, Lake Oswego, OR (US); Ruifeng Guo, Portland, OR (US); Yu Huang, Sudbury, MA (US); Liyang Lai, Wilsonville, OR (US); Etienne Racine, Blainville (CA); Martin Keim, Sherwood, OR (US); Ronald Press, West Linn, OR (US); Jing Ye, Beijing (CN); Yu Hu, Beijing (CN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/030,011

(22) Filed: Sep. 18, 2013

Related U.S. Application Data

(63) Continuation-in-part of application No. 14/022,216, filed on Sep. 9, 2013, now Pat. No. 9,389,945.

(60) Provisional application No. 61/702,707, filed on Sep. 18, 2012.

(51) Int. Cl.
*G01R 31/3177* (2006.01)
*G01R 31/3185* (2006.01)
*G01R 31/44* (2006.01)

(52) U.S. Cl.
CPC . *G01R 31/3177* (2013.01); *G01R 31/318555* (2013.01); *G01R 31/318572* (2013.01); *G01R 31/318547* (2013.01)

(58) Field of Classification Search
CPC ........ G01R 31/3177; G01R 31/318555; G01R 31/318572; G01R 31/318547; G01R 31/318536; G01R 31/318541; G01R 31/31701; G11C 29/56; G11C 29/48
See application file for complete search history.

(56) References Cited

U.S. PATENT DOCUMENTS

| 8,778,734 B2 | 7/2014 | Metsis |
| 2004/0130944 A1* | 7/2004 | Krause et al. ........... 365/185.01 |
| 2010/0213965 A1* | 8/2010 | Chen .................. G01R 31/2853 324/762.03 |
| 2011/0102011 A1 | 5/2011 | Van der Plas et al. |
| 2012/0204073 A1 | 8/2012 | Whetsel |

(Continued)

FOREIGN PATENT DOCUMENTS

EP      2372379 A1 * 10/2011 ......... G01R 31/3185

OTHER PUBLICATIONS

JEDEC Solid State Technology Association, JEDEC Publishes Breakthrough Standard for Wide I/O mobile DRAM, Jan. 5, 2012, Business Wire.*

(Continued)

*Primary Examiner* — April Y Blair
*Assistant Examiner* — Dipakkumar Gandhi
(74) *Attorney, Agent, or Firm* — Klarquist Sparkman, LLP

(57) ABSTRACT

Aspects of the invention relate to test access architecture for stacked memory and logic dies. A test access interface for a logic die that is stacked under a memory die is disclosed. The disclosed test access interface can control testing logic core, interconnections with the memory die and with another logic die. The controlling of testing interconnections with the memory die is through a memory boundary scan register controller in the test access interface.

18 Claims, 21 Drawing Sheets

(56) References Cited

U.S. PATENT DOCUMENTS

| | | | |
|---|---|---|---|
| 2012/0324305 A1 | 12/2012 | Whetsel | |
| 2013/0024737 A1 | 1/2013 | Marinissen | |
| 2013/0044554 A1* | 2/2013 | Goel et al. | 365/200 |
| 2013/0185608 A1* | 7/2013 | Bhawmik | 714/727 |

OTHER PUBLICATIONS

Marinissen, E.J. ;Chun-Chuan Chi ; Verbree , J. ; Konijnenburg, M. "3D DfT architecture for pre-bond and post-bond testing" 3D Systems Integration Conference (3DIC), 2010 IEEE International Publication Year: 2010 , pp. 1-8.

Sunter, S.K. ; Nadeau-Dostie, B. "Complete, contactless I/O testing reaching the boundary in minimizing digital IC testing cost" Test Conference, 2002. Proceedings. International Publication Year: 2002 , pp. 446-455.

Lee, H. H.S.; Chakrabarty, K. "Test Challenges for 3D Integrated Circuits" vol. 26 , Issue: 5 Publication Year: 2009 , pp. 26-35.

E. J. Marinissen, et al. A DfT Architecture for 3D-SICs Based on a Standardizable Die Wrapper. Journal of Electronic Testing: Theory and Applications, 28(1):73-92, Feb. 2012.

E. J. Marinissen and Y. Zorian, "Testing 3D Chips Containing Through-Silicon Vias," Proc. of International Test Conference (ITC), paper ET1.1, 2009.

Brion Keller, "DFT Insertion and Interconnect Test Generation for 3D Stacks with JEDEC Wide-IO DRAM", North Atlantic Test Workshop, 2012.

J.-Q. Lu, "3-D Hyperintegration and Packaging Technologies for Micronano Systems," Proceedings of the IEEE, vol. 97, No. 1, pp. 18-30, Jan. 2009.

M. Koyanagi, T. Fukushima, and T. Tanaka, "High-Density Through Silicon Vias for 3-D LSIs," Proceedings of the IEEE, vol. 97, No. 1, pp. 49-59, Jan. 2009.

V. F. Pavlidis and E. G. Friedman, "Interconnect-based Design Methodologies for Three-Dimensional Integrated Circuits," Proceedings of the IEEE, vol. 97, No. 1, pp. 123-140, Jan. 2009.

Kim et al., "A 1.2 V 12.8 GB/s 2 Gb Mobile Wide-I/0 DRAM With 4 x 128 I/Os Using TSV Based Stacking", IEEE Journal of Solid-State Circuits, vol. 47, No. 1, pp. 107-116 (Jan. 2012).

Kim et al., "A 1.2 V 12.8 GB/s 2 Gb Mobile Wide-I/O DRAM With 4 x 128 I/Os Using TSV Based Stacking," *IEEE Journal of Solid-State Circuits*, vol. 47, No. 1, pp. 107-116 (Jan. 2012).

Lee et al., "Test Challenges for 3D Integrated Circuits," *IEEE Design & Test of Computers*, pp. 26-35 (Sep. 2009).

Marinissen et al., "3D DfT Architecture for Pre-Bond and Post-Bond Testing," *IEEE Int'l 3D Systems Integration Conf.*, 8 pp. (Nov. 2010).

Papameletis et al., "Automated DfT Insertion and Test Generation for 3D-SICs with Embedded Cores and Multiple Towers," *IEEE European Test Symp.*, 6 pp. (May 2013).

Sunter et al., "Complete, Contactless I/O Testing—Reaching the Boundary in Minimizing Digital IC Testing Cost," *Int'l Test Conf.*, paper 16.2, pp. 446-455 (Oct. 2002).

P. Marchal, B. Bougard, G. Katti, M. Stucchi, W. Dehaene, A. Papanikolaou, D. Verkest, B. Swinnen, and E. Beyne, "3-D Technology Assessment: Path-Finding the Technology/Design Sweet-Spot," Proceedings of the IEEE, vol. 97, No. 1, pp. 96-106, Jan. 2009.

Robert S. Patti, "Three-Dimensional Integrated Circuits and the Future of System-on-Chip Designs," Proceedings of the IEEE, 94(6):1214-1224, Jun. 2006.

E. Beyne and B. Swinnen, "3D System Integration Technologies," Proceedings of IEEE International Conference on Integrated Circuit Design and Technology (ICICDT), pp. 1-3, Jun. 2007.

H.-H. S. Lee, and K. Chakrabarty, "Test Challenges for 3D Integrated Circuits," IEEE Design and Test of Computer, 26 (5):26-35, 2009.

D. L. Lewis and H. H. S. Lee, "Test Strategies for 3D Die-Stacked Integrated Circuits," in Proc. 2009 ACM/IEEE Design Automation and Test in Europe (DATE), 2009, pp. 1-8.

D. L. Lewis and H.-H. S. Lee, "A Scan-Island based Design Enabling Prebond Testability in Die-Stacked Microprocessors," In Proc. of International Test Conference (ITC), pp. 1-8, Santa Clara, CA, USA, 2007.

D. L. Lewis and H.-H. S. Lee, "Testing Circuit-Partitioned 3D IC Designs," In Proceedings of the 8th IEEE Computer Society Annual Symposium on VLSI (ISVLSI), pp. 139-144, Tampa, FL, USA, 2009.

A. Kumar, S. M. Reddy, I. Pomeranz, and B. Bbecker, "Hyper Graph Based Partitioning to Reduce DFT Cost for Pre-Bond 3D-IC Testing," Proc. of IEEE/ACM Design, Automation & Test in Europe (DATE), pp. 1424-1429, 2011.

M. Buttrick and S. Kundu, "On Testing Prebond Dies with Incomplete Clock Networks in a 3D IC using DLLs," Proc. of IEEE/ACM Design, Automation & Test Conference in Europe (DATE), pp. 1418-1423, 2011.

T.-Y. Kim and T. Kim, "Clock Tree Synthesis with Pre-Bond Testability for 3D Stacked IC Designs," Proc. of IEEE/ACM Design Automation Conference (DAC), pp. 723-728, 2010.

X. Zhao, D. L. Lewis, H.-H. S. Lee, and S. K. Lim, "Pre-Bond Testable Low-Power Clock Tree Design for 3D Stacked ICs," In Proceedings of the 27th IEEE/ACM International Conference on Computer-Aided Design (ICCAD), pp. 184-190, San Jose, CA, USA, 2009.

E. J. Marinissen, J. Verbree, and M. Konijnenburg, "A Structured and Scalable Test Access Architecture for TSV-Based 3D Stacked ICs," Proc. of VTS, pp. 269-274, 2010.

* cited by examiner

Flow chart 500

Flow chart 600

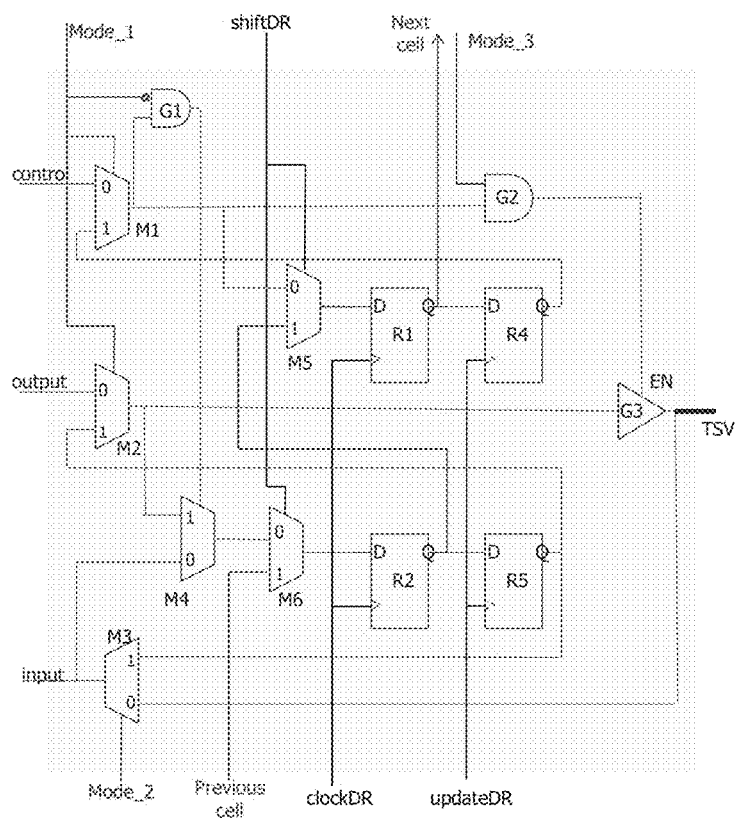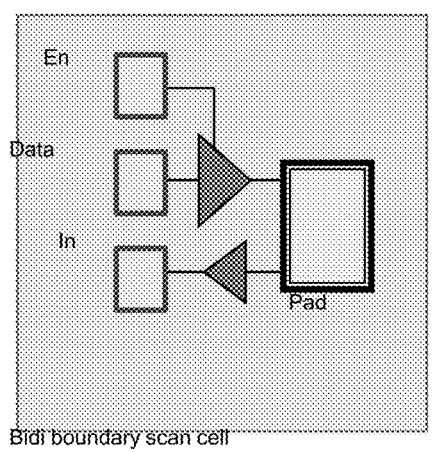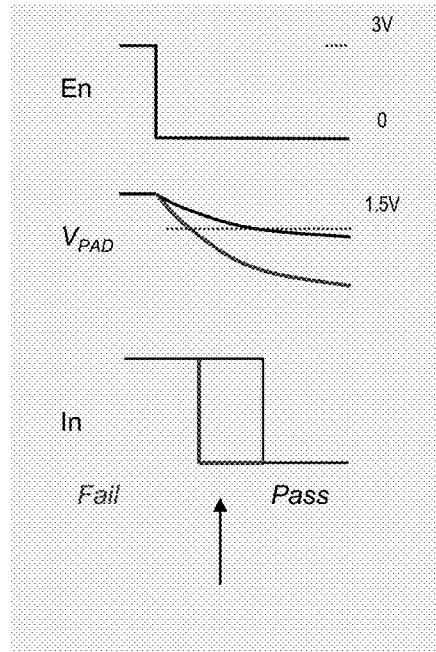
FIG. 8 – PRIOR ART

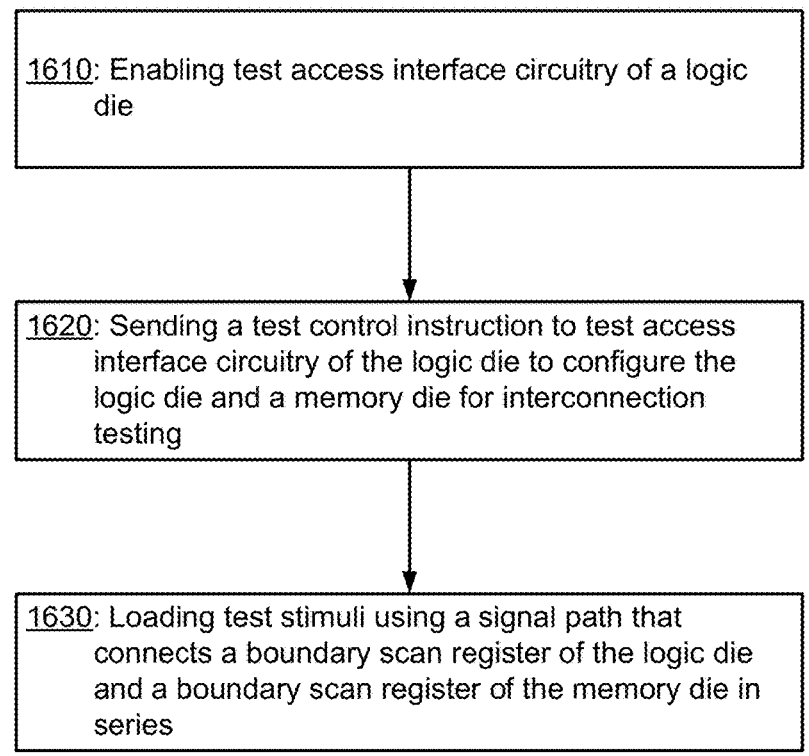
Flow chart
1600
FIG. 16

Flow chart 1700

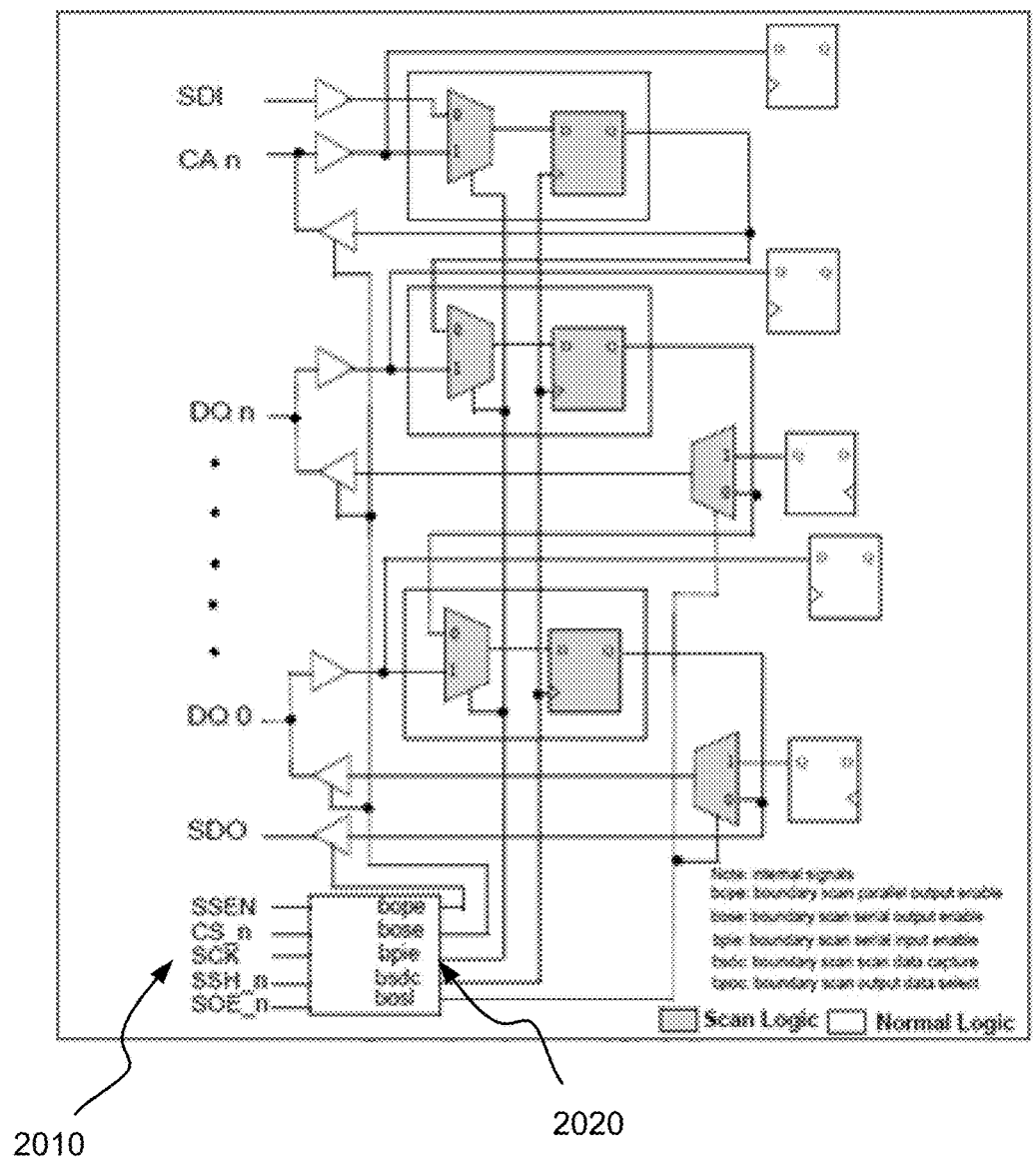
FIG. 20 – PRIOR ART

| Description | SSEN | CS_n | SSH_n | SOE_n | SCK | SDI | SDO | DQ |
|---|---|---|---|---|---|---|---|---|
| Serial Data In/Out | H | L | L | L | Valid | Valid | Valid | HiZ |
| Serial Data In | H | L | L | H | Valid | Valid | HiZ | HiZ |
| Parallel Input | H | H | H | H | Valid | x | HiZ | Valid Data In |
| Parallel Output | H | L | H | H | x | x | HiZ | Valid Data Out |
| NOP (DQ, SDO both float, no data capture) | H | H | L | x | x | x | HiZ | HiZ |
| Normal DRAM Functionality | L | Valid | x | x | x | x | HiZ | Valid |

FIG. 21 – PRIOR ART

TEST ACCESS ARCHITECTURE FOR STACKED MEMORY AND LOGIC DIES

RELATED APPLICATIONS

This application is a continuation-in-part of U.S. patent application Ser. No. 14/022,216, filed on Sep. 9, 2013, and naming Ronald Press et al. as inventors, which application is incorporated entirely herein by reference.

This application also claims priority to U.S. Provisional Patent Application No. 61/702,707, filed on Sep. 18, 2012, and naming Wu-Tung Cheng et al. as inventors, which application is incorporated entirely herein by reference.

FIELD OF THE INVENTION

The present invention relates to the field of integrated circuit (IC) testing technology. Various implementations of the invention may be particularly useful for testing stacked integrated circuits.

BACKGROUND OF THE INVENTION

Three-dimensional integrated circuits (3-D ICs) have been shown to reduce on-chip global interconnect lengths and thus alleviate delay and power consumption problems. 3-D ICs can also facilitate the integration of dissimilar technologies (digital, analog, radio-frequency circuits, et al.). In a 3-D IC, multiple active layers or dies are vertically stacked on top of each other and are interconnected using "short" vertical links. These "short" vertical links are referred to as through-silicon vias (TSVs).

While 3-D ICs provide many benefits, such benefits can be realized only when major challenges in the areas of design, manufacture and test are addressed. In traditional IC testing, wafers are probed and individual dies tested before they are packaged. For 3-D ICs, both pre-bond testing and post-bond testing of wafers are needed to increase the yield. An important aspect for the post-bond testing is testing of TSVs because TSVs are key components of a 3-D IC, providing power, clock and functional signals. Even a single TSV defect between any two layers of a 3-D IC chip stack can void the entire chip stack, reducing the overall yield. Capability of testing interconnections between stacked dies should be included in any test architecture in a circuit design.

Another important aspect for the post-bond testing is test access. One or more test interface ports must be established through the bottom die to allow test of any die in the stack and of the interconnections between the dies. Only a limited number of TSVs, however, can be reserved for use by the testing circuitry. This is because the total number of TSVs on a die is limited due to the need for a "keep-out" area and most of these TSVs are required for power, clock, and signal lines.

It is thus desirable to design a test access architecture that provides efficient test access and control through a small number of dedicated TSVs for both individual die testing and interconnection testing.

BRIEF SUMMARY OF THE INVENTION

Aspects of the invention relate to test access architecture for stacked dies.

In one aspect, there is a stack of dies comprising a memory die and a logic die. The memory die according to various embodiments of the invention comprises memory interface circuitry that comprises a MBSR (memory boundary scan register) serial input port, a MBSR serial output port and a plurality of MBSR control signal input ports. The logic die according to various embodiments of the invention comprises, at a first side of the logic die, a first input port configured to receive test stimuli and test control instructions and a first output port configured to send test responses, test stimuli and test control instructions, there being a data signal path within the logic die between the first input port and the first output port. The logic die according to various embodiments of the invention also comprises, at a second side of the logic die, a second input port being connected to the MBSR serial output port, a second output port being connected to the MBSR serial input port and a plurality of MBSR control signal output ports being connected to the plurality of MBSR control signal input ports, there being a data signal path within the logic die between the second input port and the first output port and a data signal path within the logic die between the first input port and the second output port. Further, the logic die according to various embodiments of the invention comprises test access interface circuitry for testing the logic die, for testing interconnections between the memory die and the logic die, and/or for testing, when the logic die is connected to a second logic die, interconnections between the logic die and the second logic die. The test access interface circuitry supplies MBSR control signals to the plurality of MBSR control signal output ports.

The test access interface circuitry may be compatible with IEEE 1149.1. The memory interface circuitry may be compatible with JESD 229, a JEDEC standard. Some or all of the MBSR control signals may be derived based on a test control instruction received by the test access interface circuitry. Some of the MBSR control signals may be derived based in part on control data stored in a user-defined data register in the test access interface circuitry.

The memory interface circuitry may further comprise: a first additional MBSR serial output port, the first additional MBSR serial output port and the MBSR serial input port are serial output/input ports for a first MBSR; a first additional MBSR serial input port; a second additional MBSR serial output port, the second additional MBSR serial output port and the first additional MBSR serial input port are serial output/input ports for a second MBSR; a second additional MBSR serial input port; a third additional MBSR serial output port, the third additional MBSR serial output port and the second additional MBSR serial input port are serial output/input ports for a third MBSR; and a third additional MBSR serial input port, the MBSR serial output port and the third additional MBSR serial input port are serial output/input ports for a fourth MBSR.

The test access interface circuitry accordingly further comprises: a first additional input port at the second side of the logic die being connected to the first additional MBSR serial output port; a first additional output port at the second side of the logic die being connected to the first additional MBSR serial input port, wherein there is a data signal path within the logic die between the first additional input port and the first additional output port; a second additional input port at the second side of the logic die being connected to the second additional MBSR serial output port; a second additional output port at the second side of the logic die being connected to the second additional MBSR serial input port, wherein there is a data signal path within the logic die between the second additional input port and the second additional output port; a third additional input port at the second side of the logic die being connected to the third additional MBSR serial output port; and a third additional output port at the second side of the logic die being connected to the third additional MBSR serial input port, wherein there is a data signal path within the logic die between the third additional input port and the third additional output port. The test access interface circuitry may further comprise logic for selecting one or more of the first MBSR, the second MBSR, the third MBSR, and the fourth MBSR as one boundary scan register to test corresponding interconnections.

A stack of dies according to one aspect may further comprise another logic die. The another logic die comprises, at a first side of the another logic die, a first input port of the another logic die configured to receive test stimuli and test control instructions and a first output port of the another logic die configured to send test responses, test stimuli and test control instructions, there being a data signal path within the another logic die between the first input port of the another logic die and the first output port of the another logic die. The another logic die further comprises, at a second side of the another logic die, a second input port of the another logic die being connected to the first output of the logic die and a second output port of the another logic die being connected to the first input of the logic die, there being a data signal path within the another logic die between the second input port of the another logic die and the first output port of the another logic die and a data signal path within the another logic die between the first input port of the another logic die and the second output port of the another logic die. The another logic die further comprises test access interface circuitry of the another logic die that accepts data from either the first input port of the another logic die or the second input port of the another logic die depending on an input selection signal.

The test access interface circuitry of the logic die may be enabled/disabled by the test access interface circuitry of the another logic die.

In a further aspect, there is a method for testing a stack of dies comprising a logic die and a memory die stacked on top of the logic die. The method comprises enabling test access interface circuitry of the logic die, sending a test control instruction to test access interface circuitry of the logic die to configure the logic die and the memory die for interconnection testing, and loading test stimuli using a signal path that connects a boundary scan register of the logic die and a boundary scan register of the memory die in series.

In a method according to one aspect, the test access interface circuitry of the logic die is enabled by test access interface circuitry of another logic die stacked under the logic die.

In yet another aspect, there is a method for designing a die testable in a stack of memory and logic dies. The method comprises: receiving design data of a die; modifying the design data by adding, at a first side of the die, a first input port for receiving test stimuli and test control instructions and a first output port for sending test responses, test stimuli and test control instructions; modifying the design data by providing a data signal path within the die between the first input port and the first output port; modifying the design data by adding, at a second side of the die, a second input port to be connected to a memory boundary scan register output port of a memory die and a second output port to be connected to a memory boundary scan register input port of the memory die; modifying the design data by providing a data signal path within the die between the second input port and the first output port and a data signal path within the die between the first input port and the second output port; and modifying the design data by adding test access interface circuitry for testing the die and for testing interconnections between the memory die, the test access interface circuitry configured to supply control signals to the memory die for testing interconnections.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 8 illustrates a schematic of a bi-direction boundary scan cell and a waveform diagram of contactless leakage testing.

FIG. 16 illustrates a flow chart 1600 describing a method of testing stacked memory and logic dies that may be employed by various embodiments of the invention.

FIG. 20 illustrates a boundary scan chain defined by JESD 229.

FIG. 21 illustrates a truth table for the MBSR control signals defined by JESD 229.

DETAILED DESCRIPTION OF THE INVENTION

Figure 1:
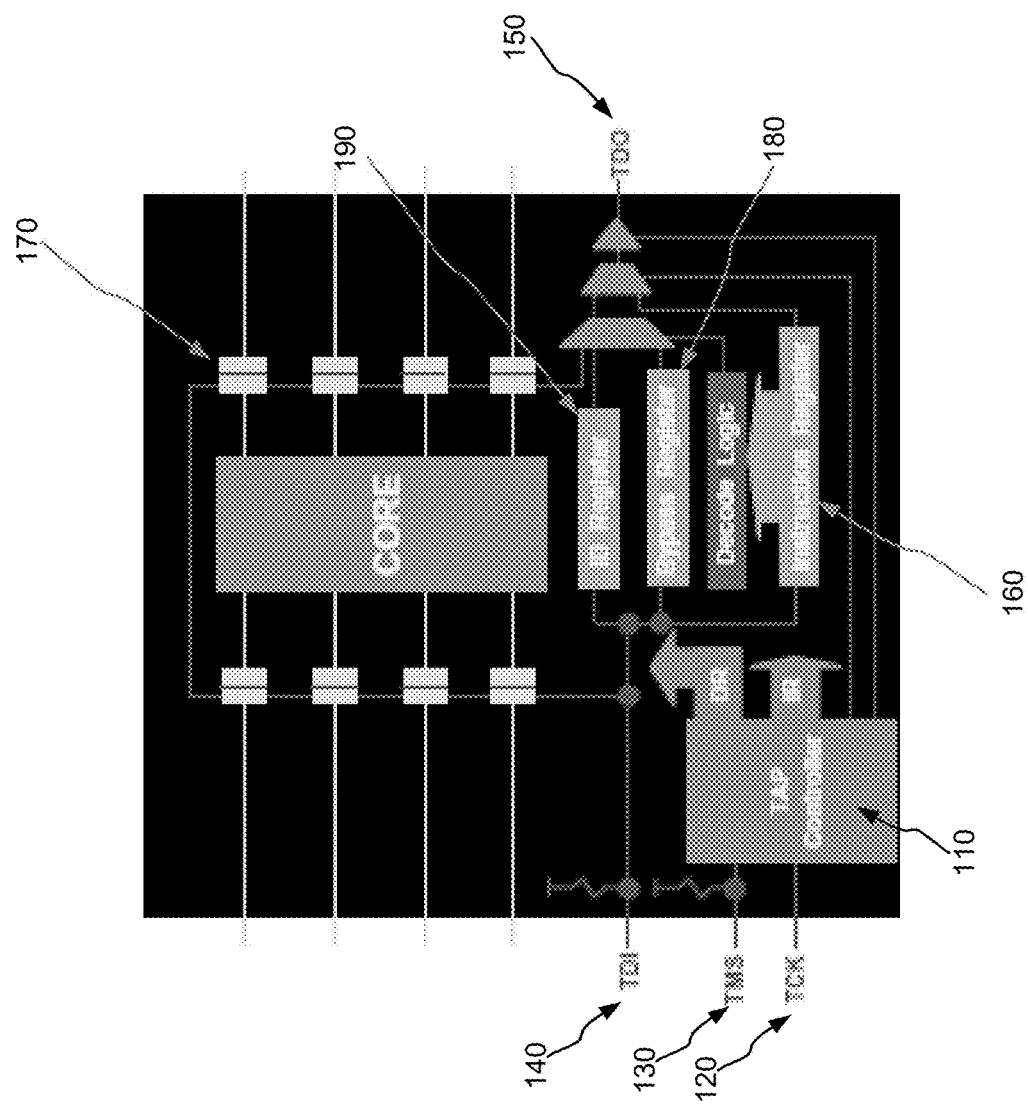
FIG. 1 illustrates a schematic of the test access architecture of IEEE Boundary Scan Standard 1149.1 (JTAG) (prior art).

Various aspects of the present invention relate to test access architecture for stacked dies. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a non-transitory computer-readable medium, software instructions executed on a processor, or some combination of both. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Additionally, the detailed description sometimes uses terms like "send", "receive", and "load" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

The present disclosure also includes some hardware drawings. These drawings are only schematic and are non-limiting. For illustrative purposes, the size of some of the elements in the drawings may be exaggerated and not drawn on scale, and some elements in the drawings may be omitted.

The hardware description sometimes uses terms like "first", "second", "third" and the like to distinguish between similar elements and not necessarily for describing a sequential or chronological order. The terms are interchangeable under appropriate circumstances and the embodiments of the invention can operate in other sequences than described or illustrated herein. Similarly, the terms "top", "bottom", "over", "under" and the like in the description are used for descriptive purposes and not necessarily for describing relative positions. The terms so used are interchangeable under appropriate circumstances and the embodiments of the invention described herein can operate in other orientations than described or illustrated herein.

The test access architecture according to embodiments of the invention is based on a modular test approach, as will be discussed in detail later. The test access interface of a die in a stack according to embodiments of the invention may be made compatible with an industry standard such as IEEE Boundary Scan Standard 1149.1, allowing the die to have a stand-alone test access interface for both pre-bonding and post-bonding tests. Moreover, the test access interface of any die in a stack according to embodiments of the invention may be deselected (disabled) during a test. Test mode activity or functional mode activity, initiated when the test access interface is selected (enabled), can remain active even after the test access interface is deselected. Before discussing embodiments of the invention, the test access architecture of IEEE Boundary Scan Standard 1149.1 is briefly described.

FIG. 1 illustrates a schematic of the test access architecture of IEEE Boundary Scan Standard 1149.1, also known as JTAG. The TAP controller 110 is a 16-state finite state machine (FSM) that controls the JTAG engine based on test control signals and test control instructions supplied through the TAP (test access port). The TAP has four pins that receive test control signals, test control instructions and test stimuli for driving the circuit blocks and controlling specific operations: TCK (JTAG Test Clock) 120, TMS (Test Mode Select) 130, TDI (Test Data Input) 140 and TDO (Test Data Output) 150. An optional pin, TRST (Test Reset), is not depicted in FIG. 1. At the rising edge of the TCK signal, the TMS signal determines the TAP controller state sequence. Keeping the TMS signal stable can prevent the TAP controller from changing its state. The TDI pin 140 and the TDO pin 150 are the serial data/instruction input and the serial data/instruction output, respectively. One bit of data is transferred in from the TDI pin 140, and out to the TDO pin 150 per rising clock edge of the TCK signal. The TRST control signal, when low, resets the test logic by forcing the TAP controller 110 to enter a reset state.

The instruction register 160 is a shift register-based circuit and is serially loaded with test control instructions. After a new test control instruction is shifted into the instruction register 160, the previous test control instruction remains valid until the TAP controller 110 changes to the state of updating instruction register. The TAP controller 110 can also reset, access the instruction register 160, or access data selected by the instruction register 160. The state of the TAP controller 110 and contents of the instruction register 160 determine which register (the boundary scan register 170, the instruction register 160, the bypass register 180, the ID register 190 or any other registers) is fed by the TDI pin 140 for any operation.

Figure 2:
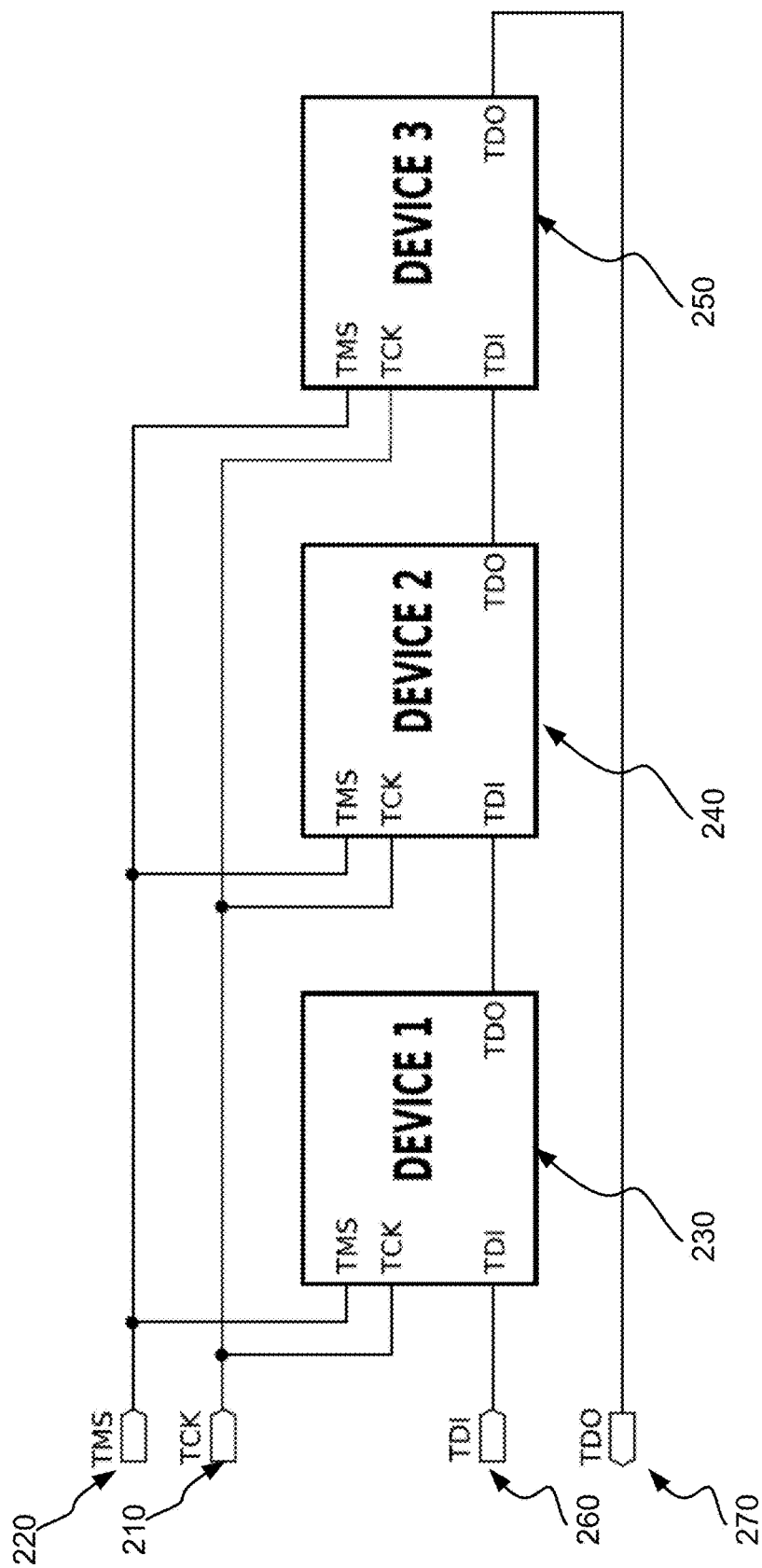
FIG. 2 illustrates an example of a JTAG chain of three devices (prior art).

FIG. 2 illustrates an example of a JTAG chain. The TCK signal and the TMS signal, broadcasted through the pins 210 and 220, respectively, are shared by the three devices 230, 240 and 250. The TDO pin of the device 230 is connected to the TDI pin of the device 240 and the TDO pin of the device 240 is connected to the TDI pin of the device 250. The system TDI pin 260 and the system TDO pin 270 are connected to the TDI pin of the device 230 and the TDO pin of the device 250, respectively. Different test control instructions may be shifted into different devices such that they can work in different modes. For example, the devices 230 and 240 are configured so that their interconnections are tested while the device 250 is configured to perform a device test.

Embodiments of the invention include dies comprising test circuitry for testing the die and/or for testing, when the die is stacked, interconnections between the die and an adjacent die. The test circuitry comprises, at a first side of the die, a first input port configured to receive test stimuli and test control instructions and a first output port configured to send test responses, test stimuli and test control instructions, there being a data signal path within the die between the first input port and the first output port. The test circuitry also comprises, at a second side of the die, a second input port configured to receive test responses, test stimuli, and test control instructions from another die and a second output port configured to send test stimuli and test control instructions to the another die, there being a data signal path within the die between the second input port and the first output port and a data signal path within the die between the first input port and the second output port. Further, the test circuitry also comprises test access interface circuitry that accepts data from either the first input port or the second input port depending on an input selection signal.

Figure 3:
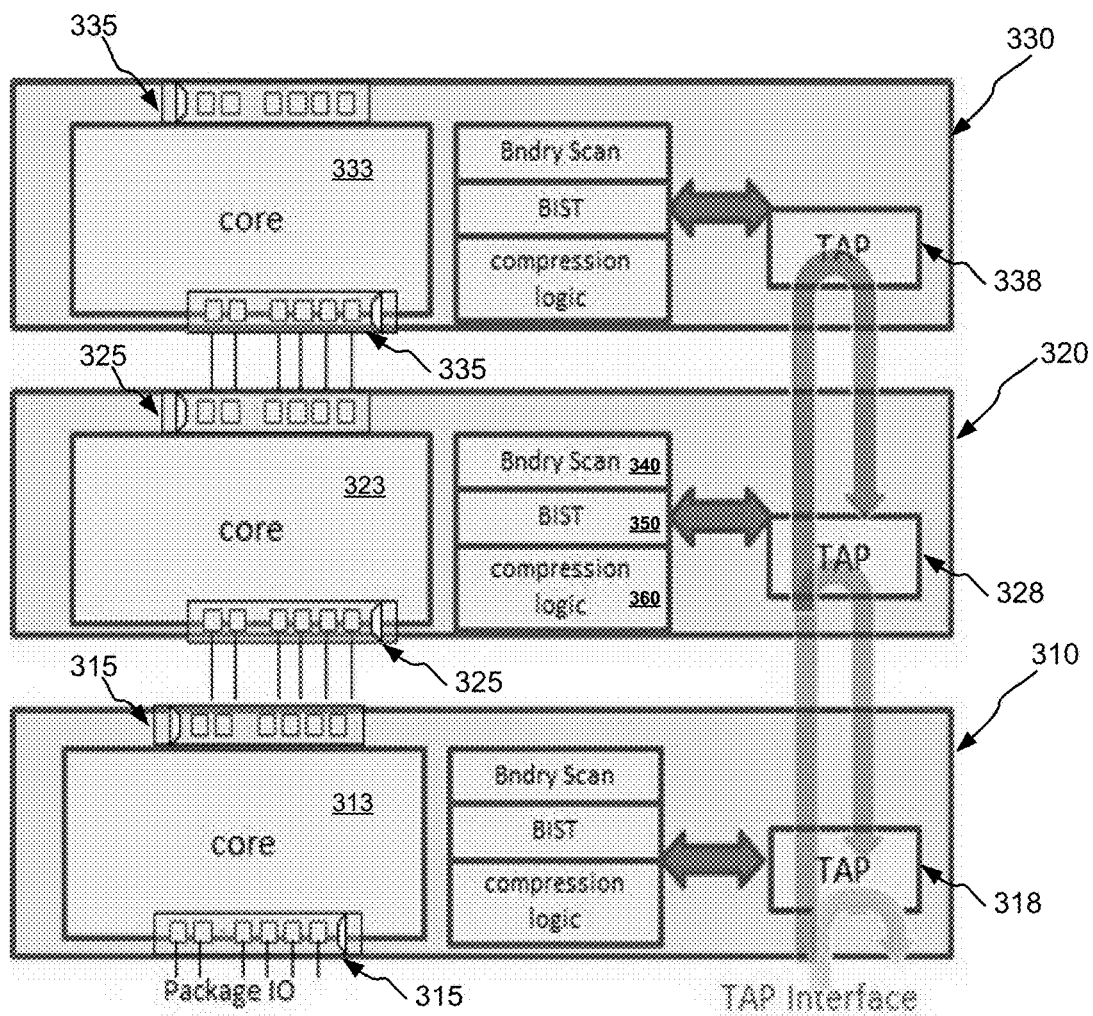
FIG. 3 illustrates an example of test access architecture for stacked dies based on JTAG-compatible test access interfaces according to various embodiments of the invention.

FIG. 3 illustrates an example of test access architecture for stacked dies based on JTAG-compatible test access interfaces according to various embodiments of the invention. Three stacked dies (310, 320 and 330) are shown in the figure. Core logic of each die (313, 323 and 333) is connected with its neighbor(s) through TSVs, of which functionality can be overridden by boundary scan cells (315, 325 and 335). One type of the boundary scan cells that may be employed by various embodiments of the invention is bi-direction boundary scan cells as illustrated in FIG. 8. The use of bi-direction boundary scan cells enables contactless leakage testing, as discussed in a paper by Sunter et al., "Complete, contactless I/O testing reaching the boundary in minimizing digital IC testing cost," Proceedings of International Test Conference, 446-455, 2002, which is incorporated herein by reference.

For testing, each die (at least for the dies 310 and 320) has an input port and an output port on each side of the die (referred to herein after as top and bottom sides, respectively). At the bottom side, the input port is configured to receive test stimuli and test control instructions while the output port is configured to send test responses. At the top side, the input port configured to receive test responses, test stimuli, and test control instructions from another die while the output die is configured to send test stimuli and test control instructions to the another die. The test stimuli may be used to test interconnections between dies or core logic. The test responses are generated from the corresponding tests. The test control instructions are stored in instruction registers and used by the test access interfaces to control the test access architecture.

Figure 4:
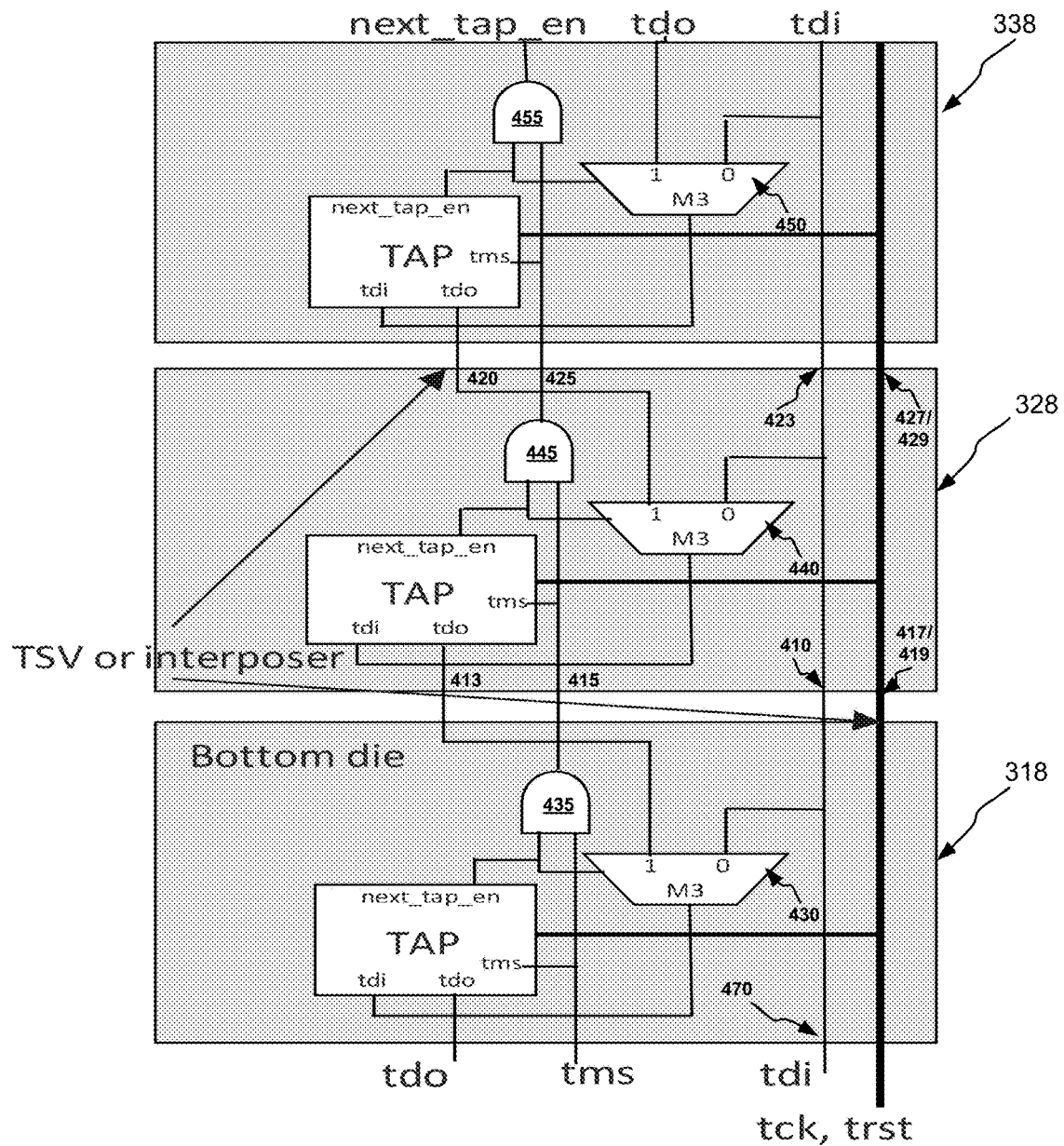
FIG. 4 illustrates an example of a schematic diagram for the daisy-chained JTAG-compatible test access interfaces shown in FIG. 3.

Each die also has a JTAG-compatible test access interface (318, 328 and 338), daisy-chained through the above input/output ports. These test access interfaces provide access and control for testing cores (BIST 340 and/or compression logic 350) and interconnections (Bndry Scan 360). FIG. 4 illustrates an example of a schematic diagram for these daisy-chained JTAG-compatible test access interfaces. In addition to the input and output ports (e.g., ports 410, 413, 420 and 423 for die 320) for data/instructions (TDI and TDO) discussed above, two or three input ports and corresponding output ports for control signals of TCK, TMS and optionally TRST are located at the bottom side and the top side, respectively (e.g., ports 415, 417/419, 425 and 427/429 for die 320).

As can be seen in FIG. 4, for each of the test access interfaces, there are a data signal path within the die between the input port for data/instructions at the bottom side and the output port for data/instructions at the bottom side (e.g., between ports 410 and 413), a data signal path within the die between the input port for data/instructions at the top side and the output port for data/instructions at the bottom side (e.g., between ports 420 and 413), and a data signal path within the die between the input port for data/instructions at the bottom side and the output port for data/instructions at the top side (e.g., between ports 410 and 423).

The test access interface for each die accepts data from either the input port for data/instructions at the bottom side or the input port for data/instructions at the top side based on an input selection signal. In FIG. 4, the input selection is controlled by a multiplexer (430, 440 and 450 for the test access interfaces 318, 328 and 338, respectively). The multiplexer is controlled by a next_tap_en signal that serves as the input selection signal) generated by the corresponding test access interfaces.

As also can be seen in FIG. 4, for each of the test access interfaces, there is a data signal path for each of the control signals within the die between the corresponding input port at the bottom side and the corresponding output port at the top side (e.g., between ports 415 and 425). An AND gate is inserted into the signal path for the control signal of TMS (gates 435, 445 and 455 for the test access interfaces 318, 328 and 338, respectively). By blocking/unblocking the signal path of TMS, the test access interface of the adjacent die above the die where the signal path is located can be deactivated/activated. The blocking/unblocking may be controlled by the same signal used for selecting inputs for the test access interface. In FIG. 4, for example, the next_tap_en signal is used to control both the multiplexer 440 and the AND gate 445 for the test access interface 328. This next_tap_en signal may be derived from a test control instruction in the test access interface. A bit in the test control instruction, for example, may be used for the next_tap_en signal.

Different implementations of enabling/disabling the test access interface of the adjacent die may be adopted. For example, Instead of blocking/unblocking the control signal of TMS, the control signal of TRST may be used to select/deselect (enabling/disabling) the test access interface of the adjacent die. As the deselecting also resets the test access interface, it cannot continue performing whatever test mode it may have been previously configured for.

Figure 5:
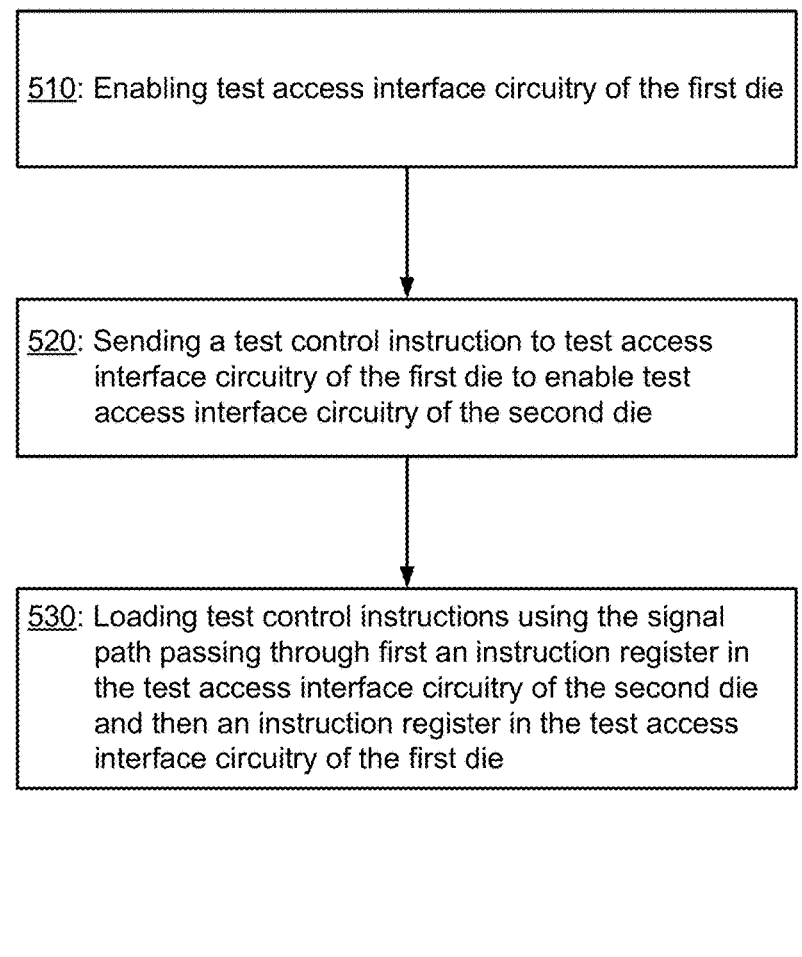
FIG. 5 illustrates a flow chart 500 describing a method of testing stacked dies that may be employed by various embodiments of the invention.

FIG. 5 illustrates a flow chart 500 describing a method of testing stacked dies that may be employed by various embodiments of the invention. For ease of understanding, the flowchart 500 will be described with reference to the test access architecture illustrated in FIG. 3 and FIG. 4. It should be appreciated, however, that alternate implementations of a test access architecture may be used to perform the method of testing stacked dies shown in the flow chart 500 according to various embodiments of the invention. In addition, it should be appreciated that implementations of the test access architecture in FIG. 3 or the test access interface in FIG. 4 may be employed with other methods of testing stacked dies according to different embodiments of the invention.

Initially, in operation 510, the test access interface 318 of the first die 310 is enabled. The first die 310 may be the bottom die of the stack. In this case, the interface 318 is automatically enabled when the control signals are applied to the stack because all of the control signals are directly applied to the interface 318. If the first die 310 has an adjacent die below, the interface 318 can be enabled by the adjacent die below similar to operation 520.

Next, in operation 520, a test control instruction is sent to the test access interface 318 to enable the test access interface 328 of the second die 320. A bit of the test control instruction may be used to generate a next_tap_en signal shown in FIG. 4. Once the test control instruction is shifted into the instruction register of the interface 318 and is applied (activated), the AND gate 435 will allow the control signal to reach and thus enable the test access interface 328. In the meantime, the test access interface 318 will accept data from the TDO port 413 of the test access interface 328, rather than from its own TDI port 470 through the multiplexer 430.

Next, in operation 530, test control instructions are loaded using a signal path passing through first the instruction register in the test access interface 328 and then the instruction register in the test access interface 318. The operation 530 may be used to prepare the two test access interfaces for subsequent tests. For example, to test interconnections between the two dies 310 and 320, test stimuli are loaded using a signal path passing through boundary scan cells in the second die and the first die in sequence. Test responses are then captured and shifted out using the same signal path.

FIGS. 9-13 illustrate detailed signal routes for testing the two dies 310 and 320 according to some embodiments of the invention. In these figures, bold lines represent active signal paths. In addition to the input/output ports for data/instructions and for the control signals, each die has additional input/output ports for testing core logic using test compression circuitry.

At the bottom side of each die, there are an input port and an output port for test stimuli and test responses (e.g., between ports 910 and 913 for die 310). A data signal path passing through the test compression circuitry connects the two ports. At the top side of each die, there are also an input port and an output port for test stimuli and test responses (e.g., 920 and 923 for die 310). There are a data signal path between the input port at the top side (e.g., 920) and the output port at the bottom side (e.g., 913), and a data signal path between the input port at the bottom side (e.g., 910) and the output port at the top side (e.g., 923).

It should be noted that more than one input ports and/or more than one output ports may be used for test stimuli and test responses and the numbers of ports for test stimuli and test responses need not to be the same. The use of dedicated and parallel ports can speed up testing core logic even though test stimuli and test responses can also use the input/output ports for those for boundary scan testing and for test control instructions (TDI and TDO).

Similar to the ports for the JTAG control signals (TCK, TMS and TRST), there are two input ports at the bottom side and two output ports at the top side for control signals used by the test compression circuitry (edt_clk and edt_update) and there are signal paths for the control signals between the input ports and the output ports.

Figure 9:
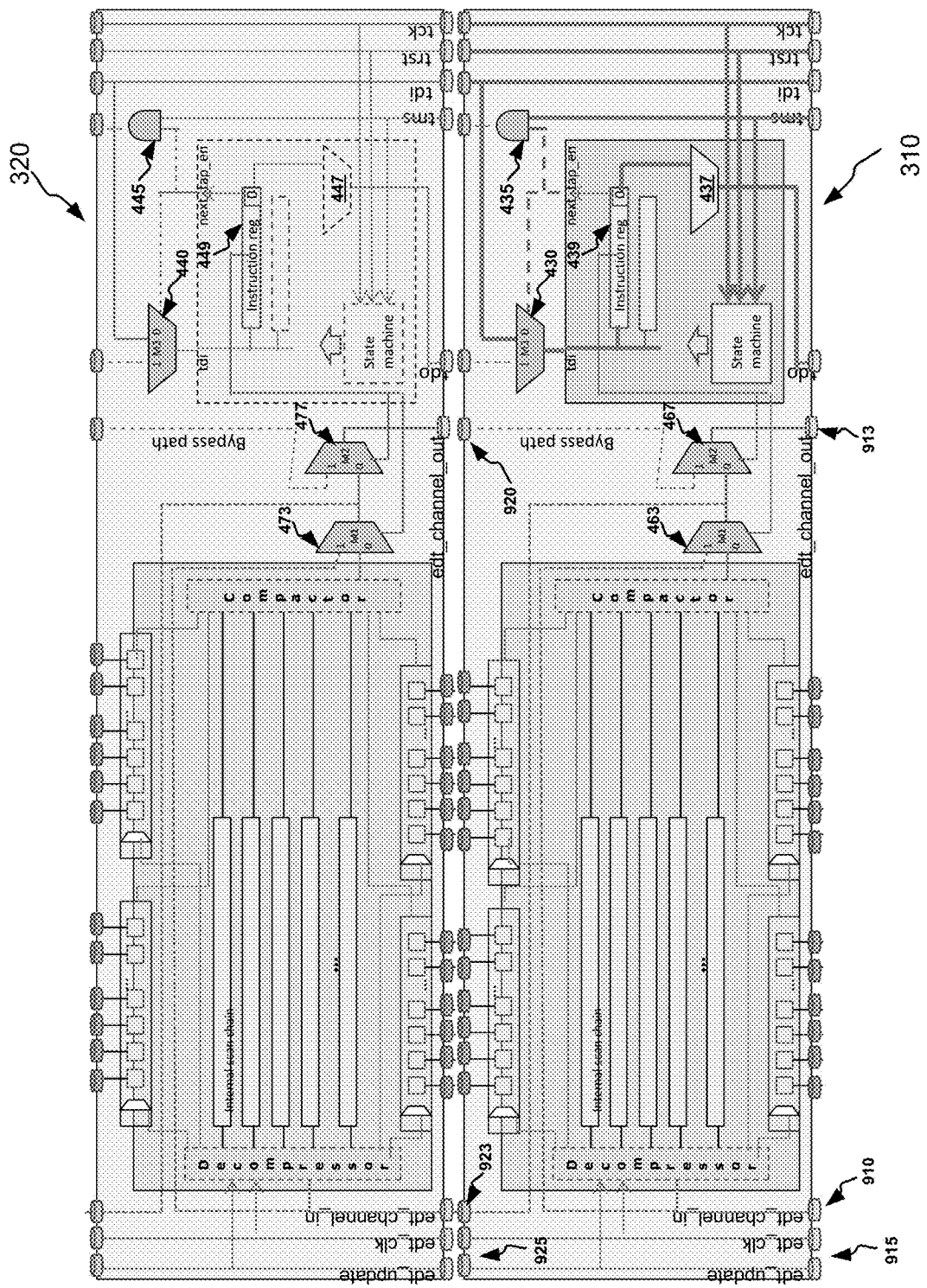
FIG. 9 illustrates an example of a signal path for loading a test control instruction to the enabled bottom die 310 in FIG. 3 according to some embodiments of the invention.

In FIG. 9, the test access interface of the die 310 is enabled by the control signals, TMS, TRST and TCK, while the test access interface of the die 320 is disabled because the AND gate 435 prevents the TMS signal from reaching it. A test control instruction is shifted into the instruction register 439 through the multiplexer 430.

Figure 10:
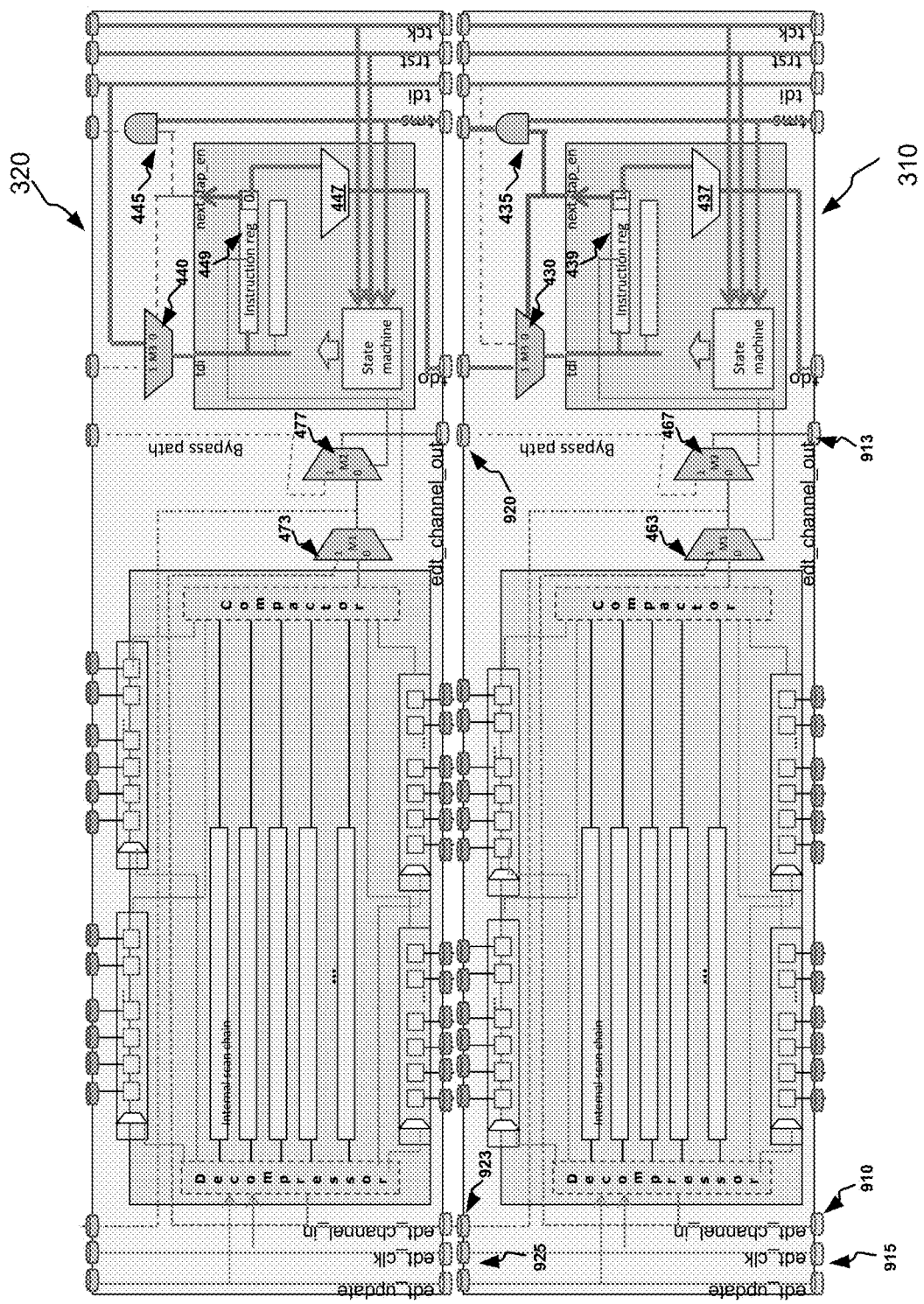
FIG. 10 illustrates an example of a signal path for loading test control instructions to the enabled bottom die 310 and the enabled middle die 320 in FIG. 3 according to some embodiments of the invention.

In FIG. 10, the test control instruction loaded in the instruction register 439 is applied and the next_tap_en signal of the test access interface of the die 310 changes accordingly. The changed next_tap_en signal allows the TMS signal to pass through the AND gate 435, enabling the test access interface of the die 320. At the same time, the multiplexer 430 switches to allow signals from the TDO output of the die 320 to enter the instruction register 439. Accordingly, test control instructions may be shifted into the two instruction registers 440 and 430 using a signal path passing through first the instruction register 440 and then the instruction register 430. Application of the loaded test control instructions prepares the test access interfaces to control testing.

Figure 11:
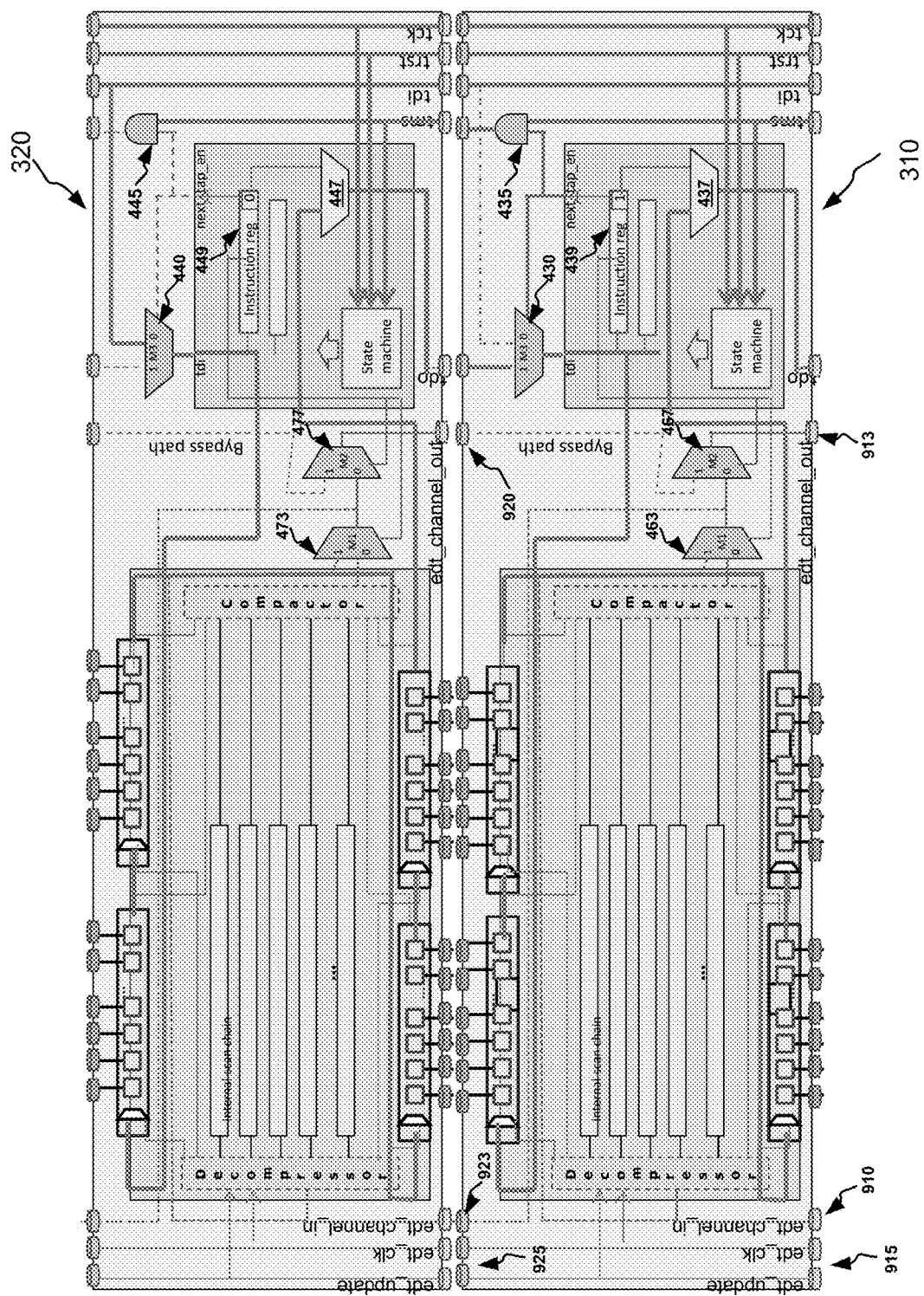
FIG. 11 illustrates an example of a signal path for loading test stimuli and unloading test responses for testing the interconnections of dies according to some embodiments of the invention.

In FIG. 11, the interconnections between the two dies 310 and 320 are tested by using the boundary scan cells. Test stimuli may be loaded and test responses may be unloaded through a signal path that passes through the multiplexer 440, the boundary scan cells in the die 320, device 447, the multiplexer 430, the boundary scan cells in the die 310, and device 437 in sequence.

Figure 12:
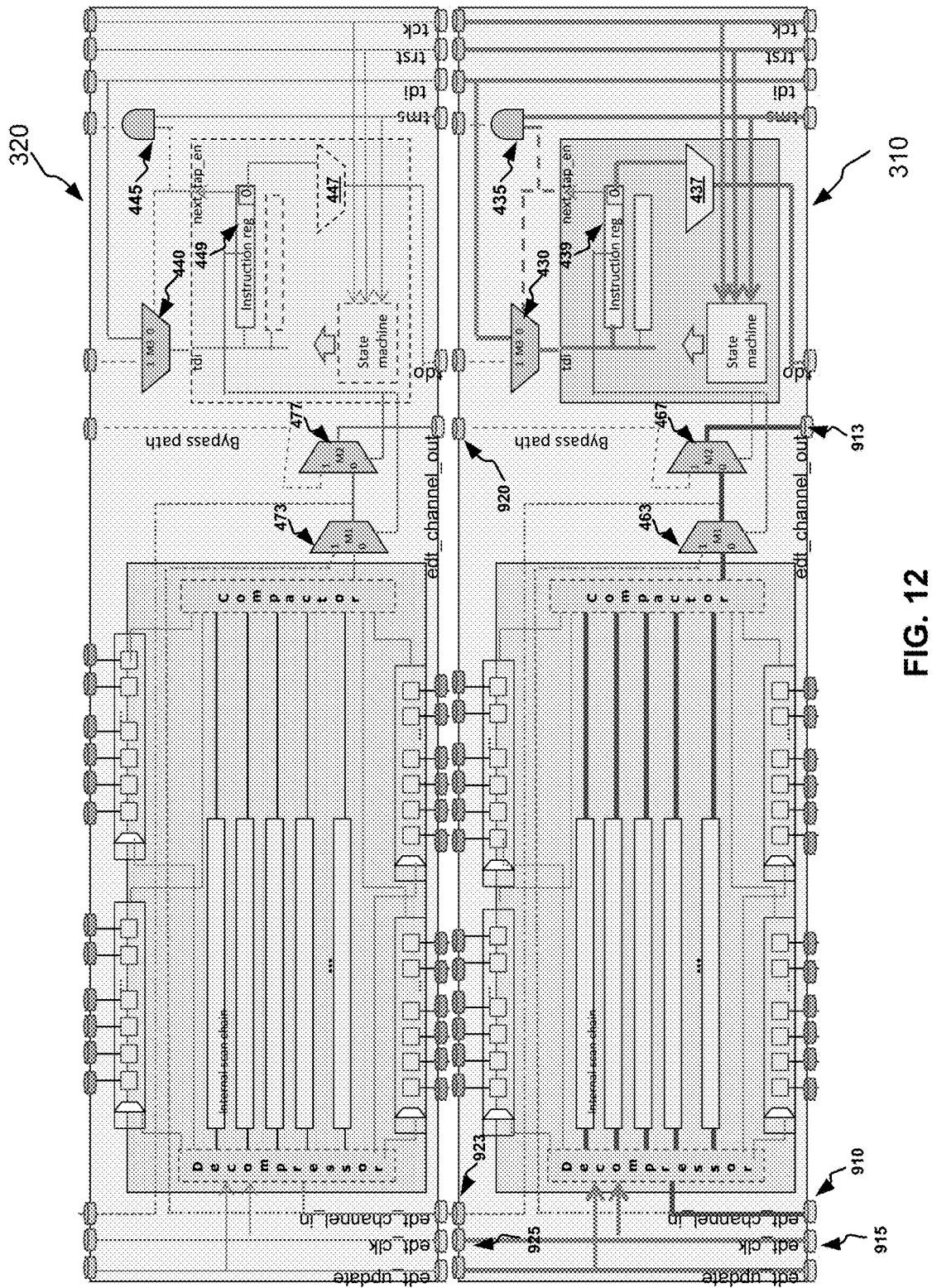
FIG. 12 illustrates an example of a signal path of test stimuli/test responses for testing core logic of the enabled bottom die 310 along with a signal path for test control instructions.

In FIG. 12, the core logic in the die 310 is tested by using the test compression circuit compressing a decompressor, scan chains and a compactor. The test control instruction may be loaded through a signal path within the die between the TDI port and the TDO port at the bottom side. Test stimuli may be loaded and test responses may be unloaded through a signal path within the die between the port 910 and the port 913.

Figure 13:
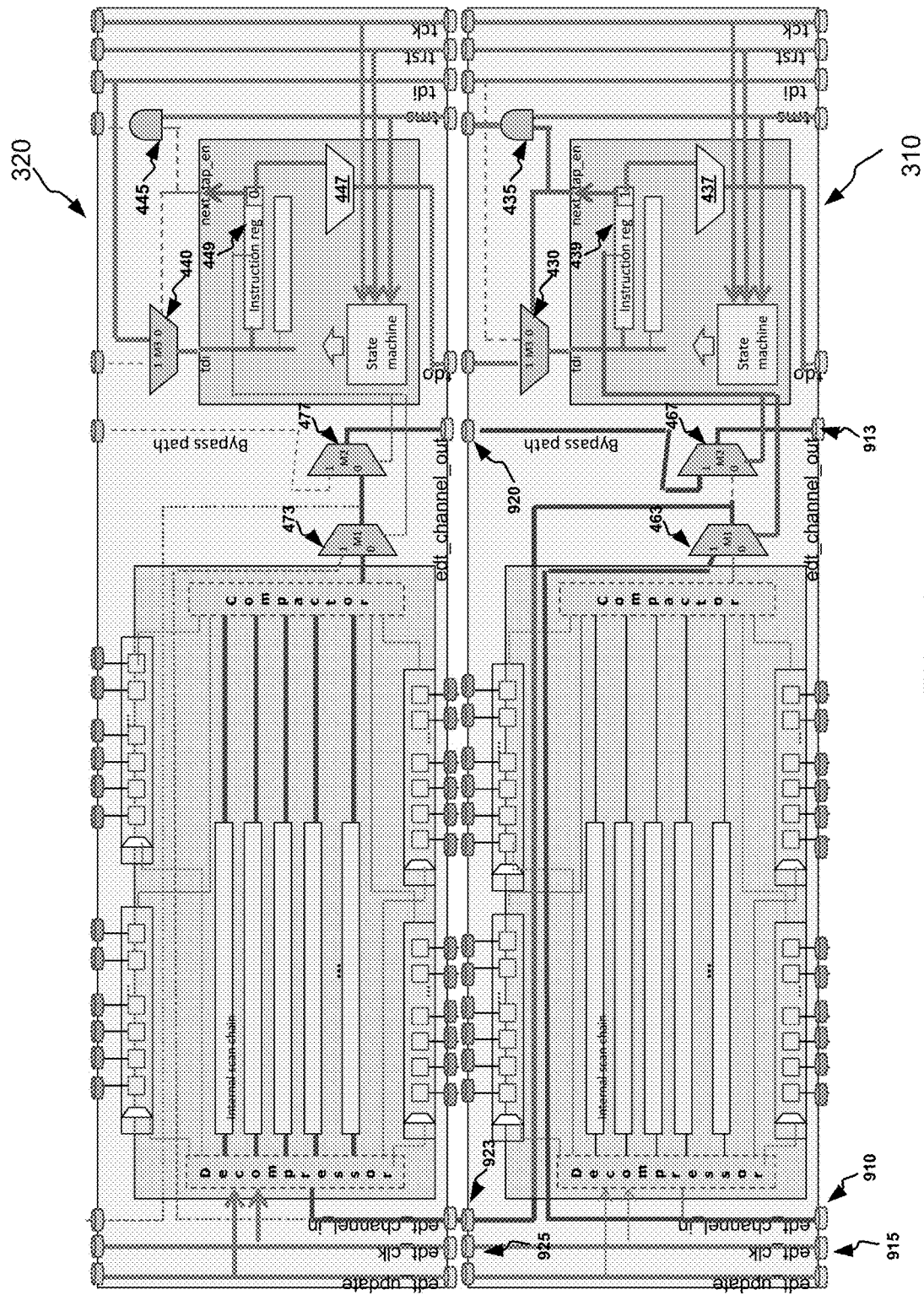
FIG. 13 illustrates an example of a signal path of test stimuli/test responses for testing core logic of the enabled middle die 320 along with a signal path for test control instructions.

In FIG. 13, the core logic in the die 320 is tested by using the test compression circuit. The test control instruction may be loaded through a signal path passing through first the instruction register 440 and then the instruction register 430. The instruction register 430 may be bypassed if the current applied test control instruction works in this mode according to some embodiments of the invention. Test stimuli may be loaded and test responses may be unloaded through a signal path that bypasses the test compression circuit and passes through a multiplexer 463, the test compression circuit in the die 320, and the multiplexers 473, 477 and 467.

The flowchart 500 may be expanded if the stack of dies contains more than two dies. The test access interface of the third die 330 may be enabled by applying the test control instruction loaded into the instruction register in the test access interface of the die 320 in operation 520. Next, another set of test control instructions may be loaded using a signal path passing through the instruction register in the test access interface of the third die 330, the instruction register in the test access interface of the second die 320 and the instruction register in the test access interface of the first die 310 in sequence. This process may be repeated if there are more dies.

To test the interconnections between the dies 330 and 320 and between the dies 320 and 310, test stimuli may be loaded by using a signal path passing through boundary scan cells in the third die 330, the second die 320 and the first die 310 in sequence. The captured test responses can be shifted out following the same signal path.

Figure 6:
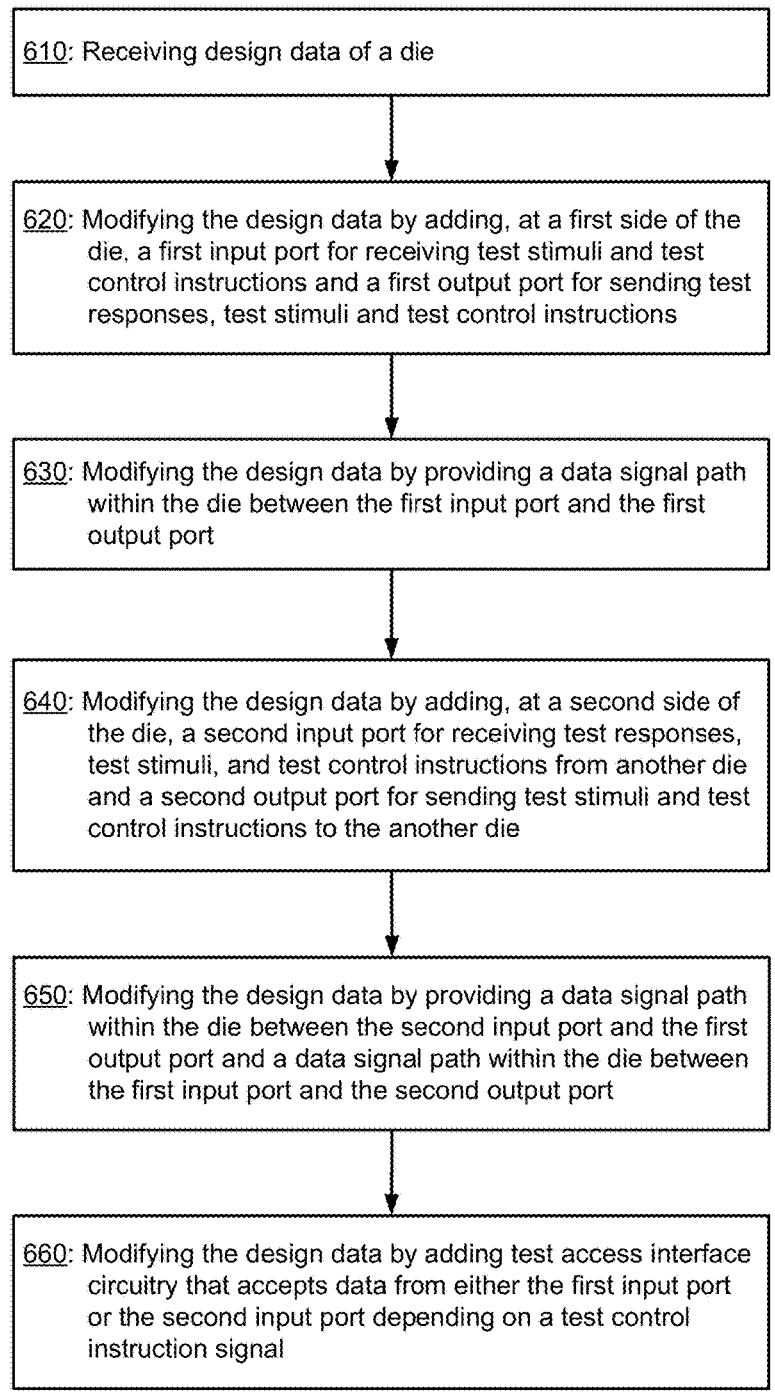
FIG. 6 illustrates a flow chart 600 describing a method of designing a die testable in a stack of dies that may be employed by various embodiments of the invention.

FIG. 6 illustrates a flow chart 600 describing a method of designing a die testable in a stack of dies that may be employed by various embodiments of the invention. The method may include operation 610, receiving design data of a die. Next, in operation 620, the method may further include modifying the design data by adding, at a first side of the die, a first input port for receiving test stimuli and test control instructions and a first output port for sending test responses, test stimuli and test control instructions. Next, in operation 630, the method may further include modifying the design data by providing a data signal path within the die between the first input port and the first output port. Next, in operation 640, the method may further include modifying the design data by adding, at a second side of the die, a second input port for receiving test responses, test stimuli, and test control instructions from another die and a second output port for sending test stimuli and test control instructions to the another die. Next, in operation 650, the method may further include modifying the design data by providing a data signal path within the die between the second input port and the first output port and a data signal path within the die between the first input port and the second output port. Next, in operation 660, the method may further include modifying the design data by adding test access interface circuitry that accepts data from either the first input port or the second input port depending on a test control instruction signal.

The methods of designing a die testable in a stack of dies according to various embodiments of the invention may be implemented by executing programming instructions on one or more programmable computers/computer systems, such as the computing system discussed later. Correspondingly, some other embodiments of the invention may be implemented by software instructions, stored on a non-transitory computer-readable medium, for instructing one or more programmable computers/computer systems to perform the methods of designing a die testable in a stack of dies.

Embodiments of the invention also include stacks of dies formed by at least a memory die and a logic die. The memory die is a die including mainly memory circuitry. The memory die according to various embodiments of the invention comprises memory interface circuitry that comprises at least a memory boundary scan register (MBSR), a MBSR serial input port, a MBSR serial output port and a plurality of MBSR control signal input ports. The logic die is a die including logic core circuitry. The logic die according to various embodiments of the invention comprises, at a first side of the logic die, a first input port configured to receive test stimuli and test control instructions and a first output port configured to send test responses, test stimuli and test control instructions, there being a data signal path within the logic die between the first input port and the first output port. The logic die according to various embodiments of the invention also comprises, at a second side of the logic die, a second input port being connected to the MBSR serial output port, a second output port being connected to the MBSR serial input port and a plurality of MBSR control signal output ports being connected to the plurality of MBSR control signal input ports, there being a data signal path within the logic die between the second input port and the first output port and a data signal path within the logic die between the first input port and the second output port. Further, the logic die according to various embodiments of the invention comprises test access interface circuitry for testing the logic die, for testing interconnections between the memory die and the logic die, and/or for testing, when the logic die is connected to a second logic die, interconnections between the logic die and the second logic die. The test access interface circuitry supplies MBSR control signals to the plurality of MBSR control signal output ports.

The memory interface circuitry may further comprise: a first additional MBSR serial output port, the first additional MBSR serial output port and the MBSR serial input port are serial output/input ports for a first MBSR; a first additional MBSR serial input port; a second additional MBSR serial output port, the second additional MBSR serial output port and the first additional MBSR serial input port are serial output/input ports for a second MBSR; a second additional MBSR serial input port; a third additional MBSR serial output port, the third additional MBSR serial output port and the second additional MBSR serial input port are serial output/input ports for a third MBSR; and a third additional MBSR serial input port, the MBSR serial output port and the third additional MBSR serial input port are serial output/input ports for a fourth MBSR.

The test access interface circuitry accordingly further comprises: a first additional input port at the second side of the logic die being connected to the first additional MBSR serial output port; a first additional output port at the second side of the logic die being connected to the first additional MBSR serial input port, wherein there is a data signal path within the logic die between the first additional input port and the first additional output port; a second additional input port at the second side of the logic die being connected to the second additional MBSR serial output port; a second additional output port at the second side of the logic die being connected to the second additional MBSR serial input port, wherein there is a data signal path within the logic die between the second additional input port and the second additional output port; a third additional input port at the second side of the logic die being connected to the third additional MBSR serial output port; and a third additional output port at the second side of the logic die being connected to the third additional MBSR serial input port, wherein there is a data signal path within the logic die between the third additional input port and the third additional output port. The test access interface circuitry may further comprise logic for selecting one or more of the first MBSR, the second MBSR, the third MBSR, and the fourth MBSR as one boundary scan register to test corresponding interconnections.

According to some embodiments of the invention, a stack of dies as described above include another logic die under the logic die. The another logic die comprises, at a first side of the another logic die, a first input port of the another logic die configured to receive test stimuli and test control instructions and a first output port of the another logic die configured to send test responses, test stimuli and test control instructions, there being a data signal path within the another logic die between the first input port of the another logic die and the first output port of the another logic die. The another logic die also comprises, at a second side of the another logic die, a second input port of the another logic die being connected to the first output of the logic die and a second output port of the another logic die being connected to the first input of the logic die, there being a data signal path within the another logic die between the second input port of the another logic die and the first output port of the another logic die and a data signal path within the another logic die between the first input port of the another logic die and the second output port of the another logic die. Further, the another logic die comprises test access interface circuitry of the another logic die that accepts data from either the first input port of the another logic die or the second input port of the another logic die depending on an input selection signal.

Recently, the JEDEC solid state technology association has released the first standard for stackable memory dies (Wide I/O Single Data Rate), JESD 229. Embodiments of the invention may comprise a logic die comprising input/output ports connected to a JESD229-compatible memory interface and logic for controlling JESD 229-compatible boundary scan registers.

FIG. 20 illustrates a boundary scan chain defined by JESD 229. Five internal control signals (2020) bose, bope, bpie, bsdc, and bosl control the boundary scan chain. The control signal bpie determines whether the bit captured comes from the last scan cell or the parallel input, and the control signal bsdc provides the clock for capture and shift. The control signal bope determines whether the boundary scan cell is outputting data or not, and the control signal bosl determines whether the output data is from the scan logic or the normal logic. The control signal bose determines whether signals can be observed at SDO.

These internal control signals bpie, bsdc, bosl, and bope are generated from the memory die control signal inputs (2010) SSEN, SCK, CS_n, SSH_n, and SOE_n. The standard has defined the truth table for these inputs to control the test operation, as shown in FIG. 21. A memory die defined by JESD 229 has four channels, and each channel has one boundary scan chain. The control signal SSEN determines whether the memory die is under test mode (SSEN=1) or function mode. There is only one input channel for SSEN. For each channel, however, there is a channel for each of SCK, CS_n, SSH_n, SOE_n, SDI, and SDO. SDI and SDO are the scan input and output of a boundary scan chain. Under serial data in/out mode, data shifts along the boundary scan chain from SDI to SDO. Under parallel input/output mode, data inputs or outputs through parallel ports DQs. Among these inputs, the input CS_n is not only used in the test mode, but is also used in the function mode. The control/clock signals SSEN, SCK, CS_n, SSH_n, and SOE_n are also referred to as MBSR (memory boundary scan register) control signals.

Figure 14:
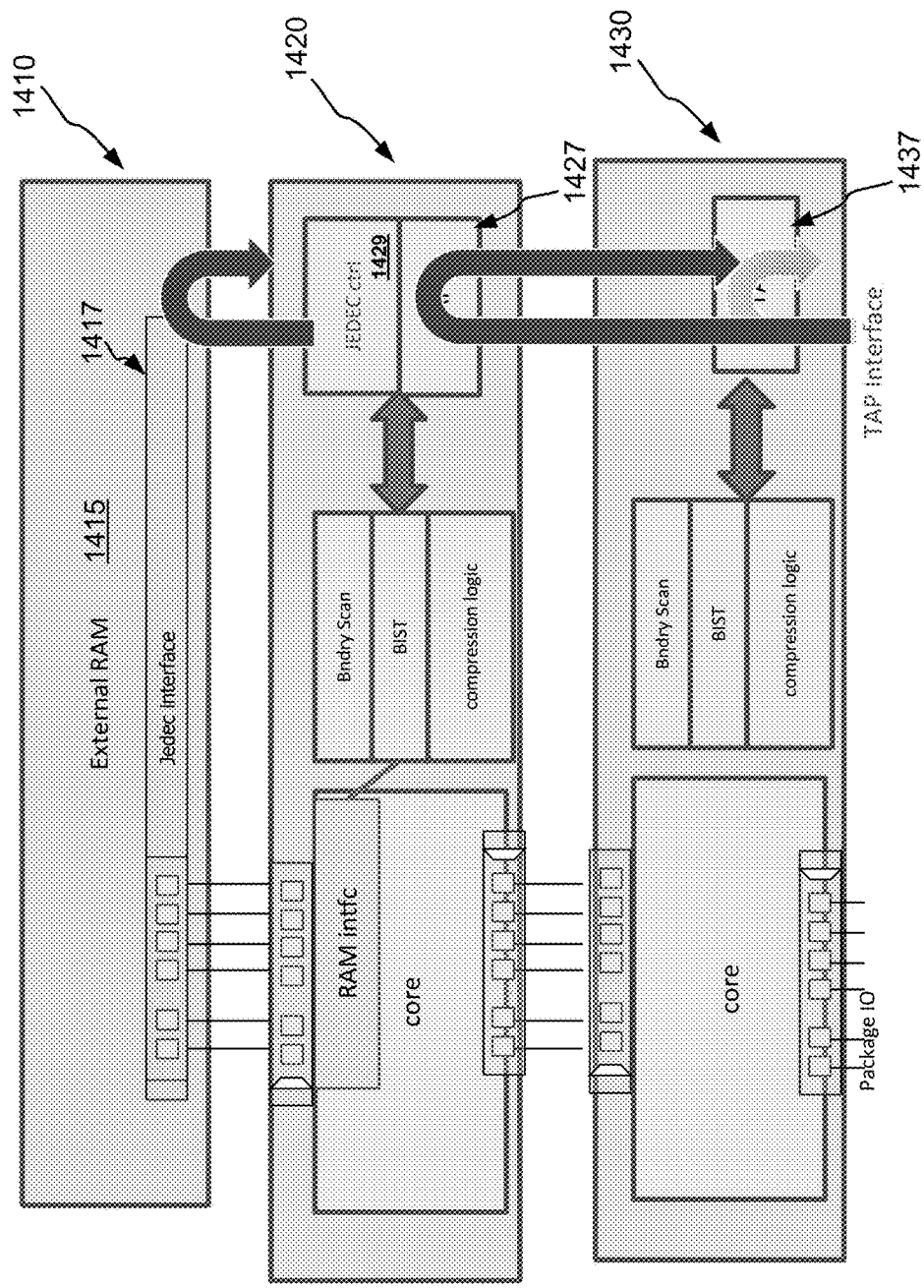
FIG. 14 illustrates an example of a stack of die including a memory die 1410 and two logic dies 1420 and 1430 according to various embodiments of the invention.

FIG. 14 illustrates an example of a stack of die including a memory die 1410 and two logic dies 1420 and 1430 according to various embodiments of the invention. The memory die include random-access memory (RAM) circuitry 1415 and memory interface circuitry 1417 compatible with JESD 229. The die 1430 has test access circuitry 1437 similar to that in the dies (310, 320 and 330) shown in FIG. 3. The whole test architectures including boundary scan registers are also similar. The test access circuitry 1427 for the die 1420, however, has a modified structure of test access circuitry 1427 due to being connected to the memory die 1410. A part 1429 of the test access circuitry 1427 is a MBSR controller containing logic for controlling the memory interface circuitry 1417.

Figure 15:
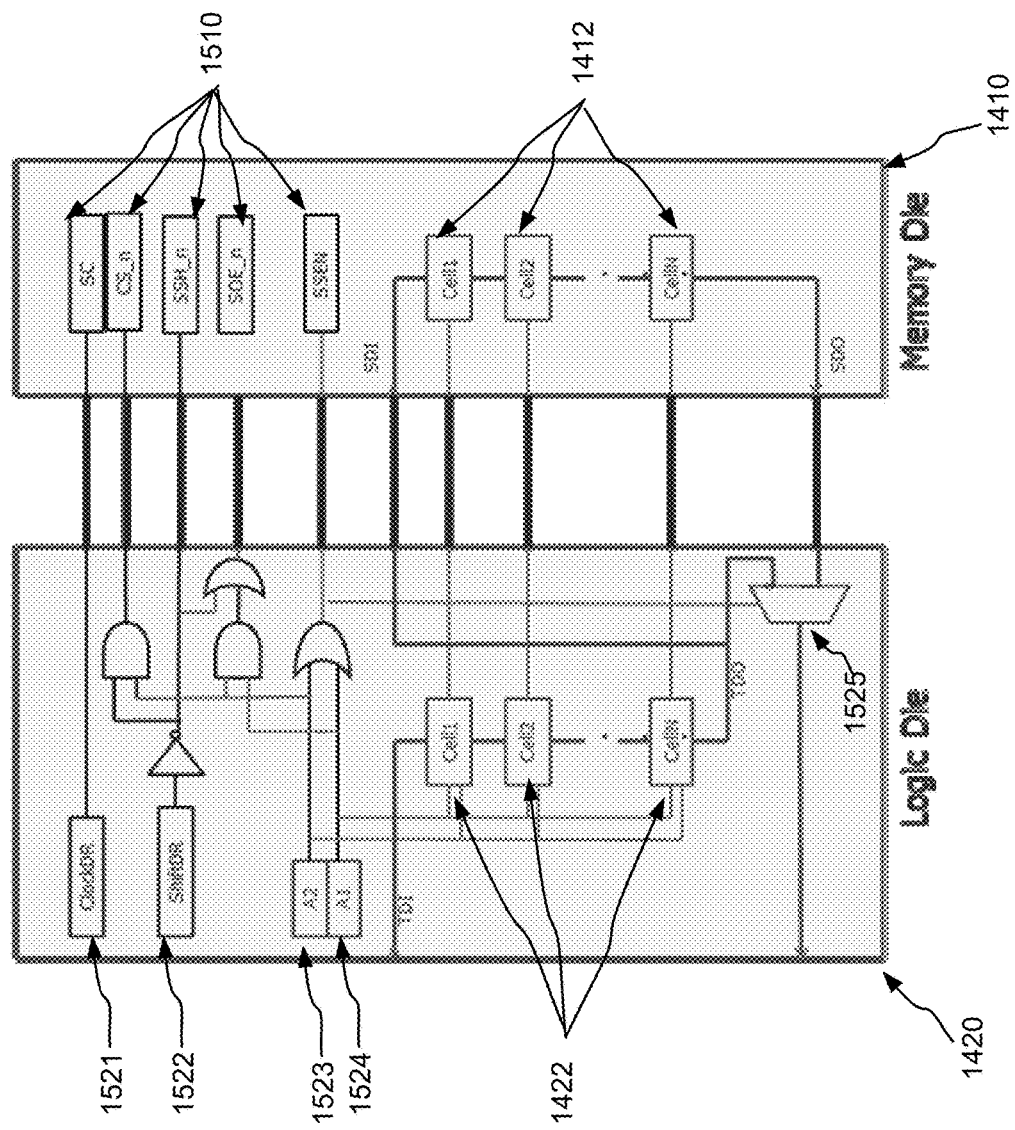
FIG. 15 illustrates an example of a schematic diagram for connected test access interfaces of a memory die and a logic die according to some embodiments of the invention.

FIG. 15 illustrates an example of a schematic diagram for the part 1429 and some related parts according to some embodiments of the invention. The figure shows two boundary scan registers 1412 and 1422 for the memory die 1410 and the logic die 1420, respectively. The multiplexer 1525 determines which boundary scan register's output is allowed to pass through. When the output of the boundary scan register 1412 is selected, the output of the boundary scan register 1422 is rerouted through the boundary scan register 1412, which effectively concatenating the two boundary scan registers. Test data (test stimuli/test responses) for testing interconnections can be shifted in and out serially through both.

Signals 1521 (ClockDR) and 1522 (ShiftDR) are boundary scan signals outputted from the TAP (IEEE 1149.1 compatible) in the test access circuitry 1427. Signals 1523 (A2) and 1524 (A1) are user-defined bits added to the instruction register in the test access circuitry 1427. These four signals are used to generate the MBSR (memory boundary scan register) control signals 1510. A combination of bits A1 and A2 also controls the multiplexer 1525.

Signals 1523 (A2) and 1524 (A1) may be derived from bits of a test control instruction received by the test access interface circuitry 1427 or data stored in a user defined data register in the test access interface circuitry 1427. Using a user-defined data register offers control flexibility but requires extra hardware.

Figure 18:
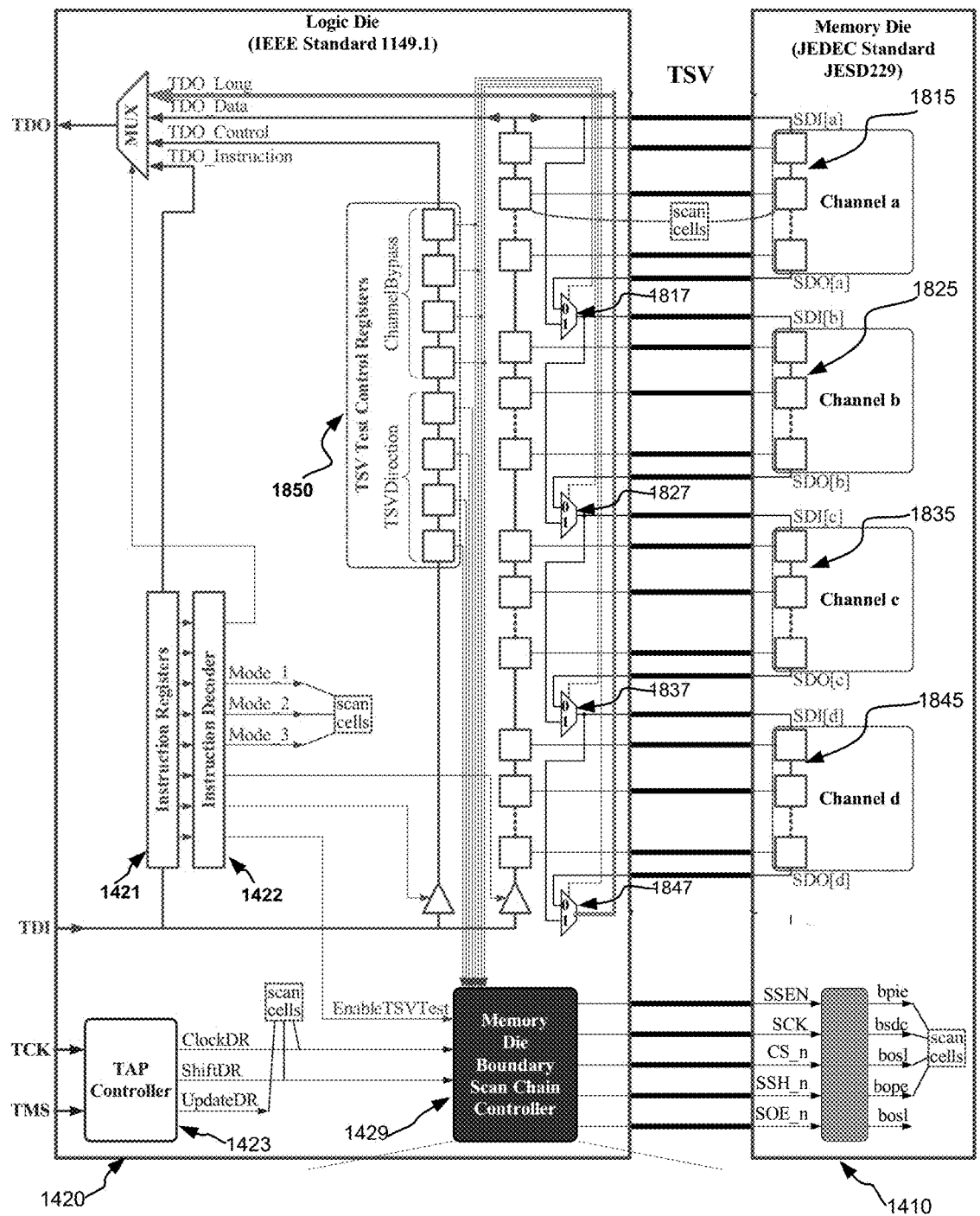
FIG. 18 illustrates another example of a schematic diagram for connecting test structures of a logic die and a memory die according to some embodiments of the invention.

FIG. 18 illustrates another example of a schematic diagram for connecting test structures of the logic die 1420 and the memory die 1410 according to some embodiments of the invention. In this figure, the memory die has four channels, each of which has a memory boundary scan register (MBSR) (1815, 1825, 1835 and 1845 for channels 1810, 1820, 1830 and 1840, respectively). The logic die has an input port and an output port being connected to the SDO and SDI port for each of the channels. Four multiplexers 1817, 1827, 1837 and 1847 are used to select one or more of the MBSRs for interconnection testing. The selected MBSRs are connected to form a single register. The test access interface circuitry 1427 has a user-defined data register 1850 storing control signals for the multiplexers and a MBSR controller 1429.

Bits of a test control instruction shifted into an instruction register 1421 and applied to an instruction decoder 1422 are used to control the operation of the boundary scan cells of the test access interface circuitry 1427 (modes 1-3 for input, output and high resistance) and to supply the user defined bits to the MBSR controller 1429.

Figure 19:
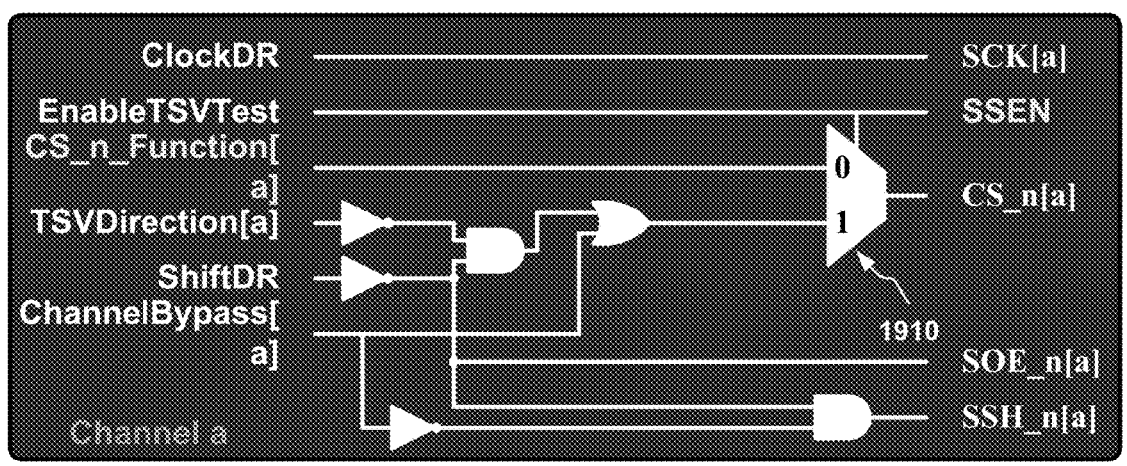
FIG. 19 illustrates an example of a detailed schematic diagram of one channel of the MBSR controller 1429 in FIG. 18.

FIG. 19 illustrates an example of a schematic diagram of one channel of the MBSR controller 1429. The signals SSEN, CS_n, SSH_n, SOE_n, and SCK of the memory die are generated based on ShiftDR and ClockDR from the TAP Controller 1423, EnableTSVTest from the Instruction Decoder 1422, and TSVDirection and ChannelBypass from the user-defined data register 1850. Please note, since the CS_n is also used in the functional mode of the memory die, a multiplexer 1910 is needed to select between the function mode and the test mode.

FIG. 16 illustrates a flow chart 1600 describing a method of testing stacked dies that may be employed by various embodiments of the invention. For ease of understanding, the flowchart 1600 will be described with reference to the test access architecture illustrated in FIG. 14 and FIG. 15. It should be appreciated, however, that alternate implementations of a test access architecture may be used to perform the method of testing stacked dies shown in the flow chart 1600 according to various embodiments of the invention. In addition, it should be appreciated that implementations of the test access architecture in FIG. 14 or the test access interface in FIG. 15 may be employed with other methods of testing stacked dies according to different embodiments of the invention.

Initially, in operation 1610, the test access interface 1427 of the logic die 1420 is enabled. In the case of the example shown in FIG. 14, the test access interface 1427 is enabled by the enabled tests access interface 1437.

Next, in operation 1620, a test control instruction is loaded into the instruction register in test access interface circuitry 1427 to configure the logic die and the memory die for interconnection testing. For example, specific values of bits A1 and A2, contained in the test control instruction, instruct the multiplexer 1525 to select the output of the boundary scan register 1412 in the memory die.

Next, in operation 1630, test stimuli are loaded using a signal path that connects the boundary scan register 1422 and the boundary scan register 1412. Interconnect tests can be performed e.g. by driving outputs of the logic die (using the boundary scan register 1422), then capturing them via the memory die inputs (connected to the boundary scan register 1412). Performing tests in the other direction is also possible.

Figure 17:
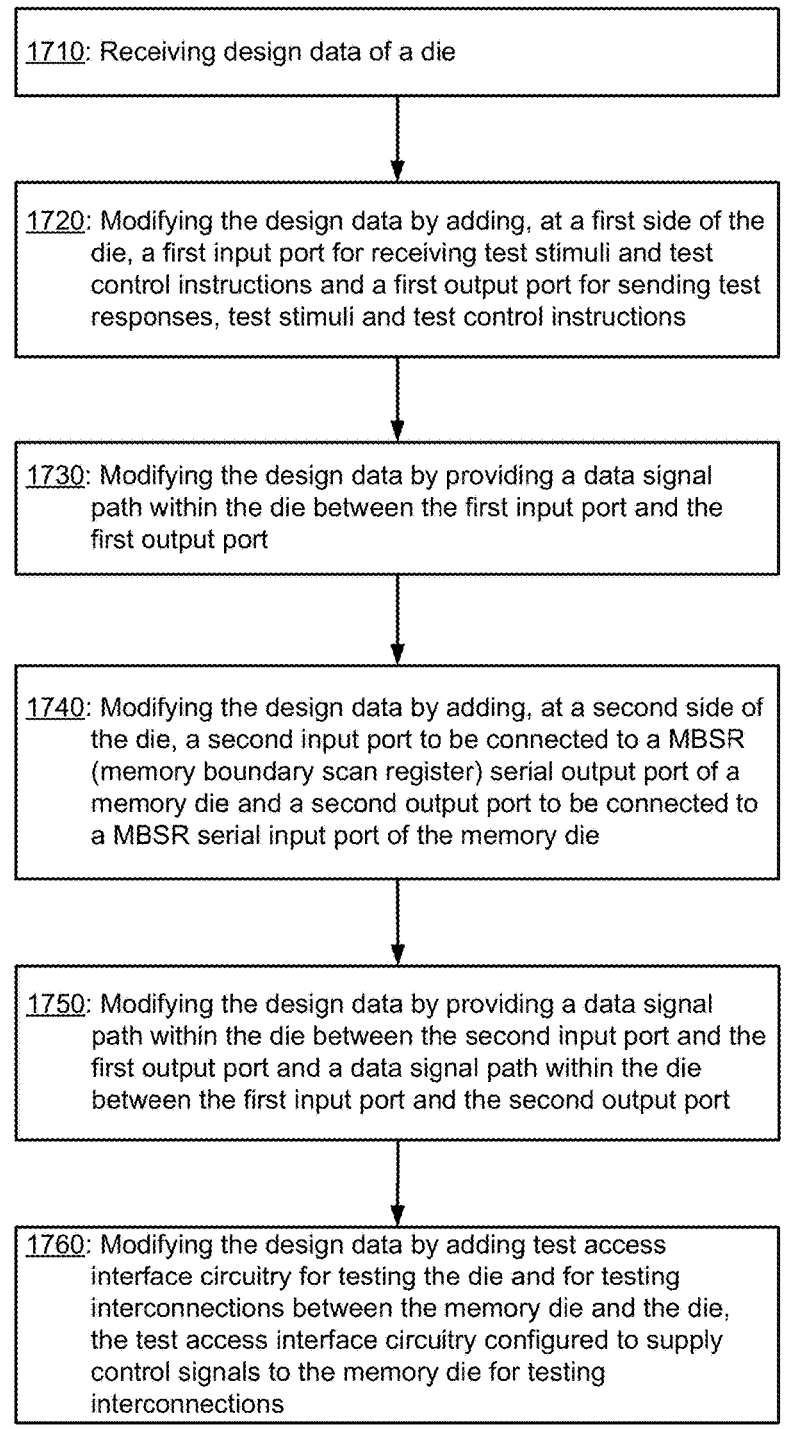
FIG. 17 illustrates a flow chart 1700 describing a method of designing a die testable in a stack of memory and logic dies that may be employed by various embodiments of the invention

FIG. 17 illustrates a flow chart 1700 describing a method of designing a die testable in a stack of dies that may be employed by various embodiments of the invention. The method may include operation 1710, receiving design data of a die. Next, in operation 1720, the method may further include modifying the design data by adding, at a first side of the die, a first input port for receiving test stimuli and test control instructions and a first output port for sending test responses, test stimuli and test control instructions. Next, in operation 1730, the method may further include modifying the design data by providing a data signal path within the die between the first input port and the first output port. Next, in operation 1740, the method may further include modifying the design data by adding, at a second side of the die, a second input port to be connected to a MBSR (memory boundary scan register) serial output port of a memory die and a second output port to be connected to a MBSR serial input port of the memory die. Next, in operation 1750, the method may further include modifying the design data by providing a data signal path within the die between the second input port and the first output port and a data signal path within the die between the first input port and the second output port. Next, in operation 1760, the method may further include modifying the design data by adding test access interface circuitry for testing the die and for testing interconnections between the memory die, the test access interface circuitry configured to supply control signals to the memory die for testing interconnections.

Figure 7:
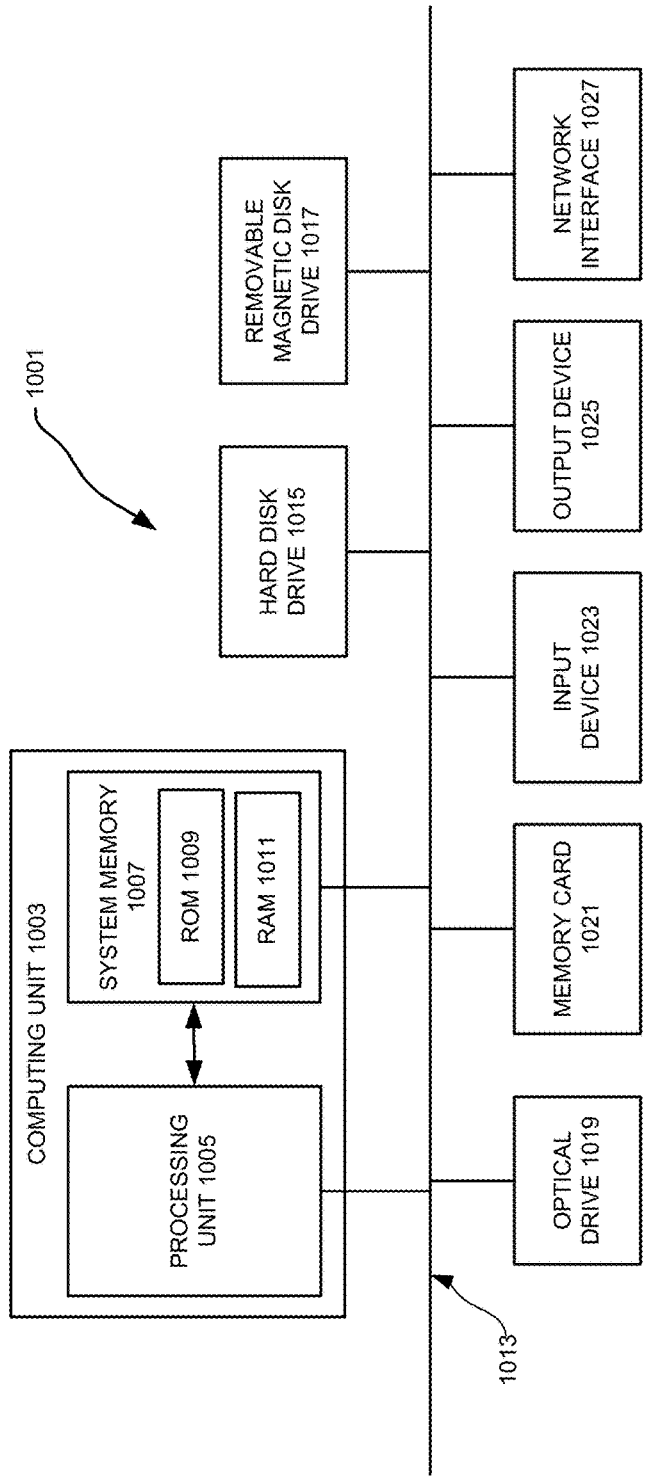
FIG. 7 illustrates a programmable computer system with which various embodiments of the invention may be employed.

Various embodiments of the invention may be implemented through the execution of software instructions by a computing device, such as a programmable computer. FIG. 7 shows an illustrative example of such a programmable computer (a computing device 1001). As seen in this figure, the computing device 1001 includes a computing unit 1003 with a processing unit 1005 and a system memory 1007. The processing unit 1005 may be any type of programmable electronic device for executing software instructions, but will conventionally be a microprocessor. The system memory 1007 may include both a read-only memory (ROM) 1009 and a random access memory (RAM) 1011. As will be appreciated by those of ordinary skill in the art, both the read-only memory (ROM) 1009 and the random access memory (RAM) 1011 may store software instructions for execution by the processing unit 1005.

The processing unit 1005 and the system memory 1007 are connected, either directly or indirectly, through a bus 1013 or alternate communication structure, to one or more peripheral devices. For example, the processing unit 1005 or the system memory 1007 may be directly or indirectly connected to one or more additional memory storage devices, such as a "hard" magnetic disk drive 1015, a removable magnetic disk drive 1017, an optical disk drive 1019, or a flash memory card 1021. The processing unit 1005 and the system memory 1007 also may be directly or indirectly connected to one or more input devices 1023 and one or more output devices 1025. The input devices 1023 may include, for example, a keyboard, a pointing device (such as a mouse, touchpad, stylus, trackball, or joystick), a scanner, a camera, and a microphone. The output devices 1025 may include, for example, a monitor display, a printer and speakers. With various examples of the computer 1001, one or more of the peripheral devices 1015-1025 may be internally housed with the computing unit 1003. Alternately, one or more of the peripheral devices 1015-1025 may be external to the housing for the computing unit 1003 and connected to the bus 1013 through, for example, a Universal Serial Bus (USB) connection.

With some implementations, the computing unit 1003 may be directly or indirectly connected to one or more network interfaces 1027 for communicating with other devices making up a network. The network interface 1027 translates data and control signals from the computing unit 1003 into network messages according to one or more communication protocols, such as the transmission control protocol (TCP) and the Internet protocol (IP). Also, the interface 1027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1001 is illustrated as an example only, and it not intended to be limiting. Various embodiments of the invention may be implemented using one or more computing devices that include the components of the computer 1001 illustrated in FIG. 7, which include only a subset of the components illustrated in FIG. 7, or which include an alternate combination of components, including components that are not shown in FIG. 7. For example, various embodiments of the invention may be implemented using a multi-processor computer, a plurality of single and/or multiprocessor computers arranged into a network, or some combination of both.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while the test access interfaces compatible with the IEEE 1149.1 standard is used to describe the invention, it should be appreciated that various examples of the invention may be implemented using other types of test access interfaces such as those compatible with the IEEE 1500 standard.

What is claimed is:
1. A stack of dies, comprising:
   a memory die, comprising:
      memory interface circuitry comprising, a memory
         boundary scan register (MBSR) serial input port, a

MBSR serial output port and a plurality of MBSR control signal input ports; and a logic die, comprising:
- a first input port configured to receive test stimuli and test control instructions;
- a first output port configured to send test responses, test stimuli and test control instructions, the first input port and the first output port being located at a first side of the logic die, wherein there is a data signal path within the logic die between the first input port and the first output port;
- a second input port being connected to the MBSR serial output port, wherein there is a data signal path within the logic die between the second input port and the first output port;
- a second output port being connected to the MBSR serial input port, wherein there is a data signal path within the logic die between the first input port and the second output port;
- a plurality of MBSR control signal output ports being connected to the plurality of MBSR control signal input ports, wherein the plurality of MBSR control signal output ports, the second input port and the second output port are located at a second side of the logic die, and
- test access interface circuitry for testing interconnections between the logic die and the memory die, the test access interface circuitry comprising a MBSR controller supplying MBSR control signals to the plurality of MBSR control signal output ports, wherein the MBSR controller comprises a multiplexer for switching between a functional mode and a test mode, wherein the test mode allows the test stimuli to be transmitted via the second output port to the MBSR serial input port.

2. The stack of dies recited in claim 1, wherein the test access interface circuitry is compatible with IEEE 1149.1.

3. The stack of dies recited in claim 1, wherein the memory interface circuitry is compatible with JESD 229, a JEDEC standard.

4. The stack of dies recited in claim 1, wherein the MBSR control signals are derived based in part on one or more bits of a test control instruction received by the test access interface circuitry.

5. The stack of dies recited in claim 1, wherein the MBSR control signals are derived based in part on control data stored in a user-defined data register in the test access interface circuitry.

6. The stack of dies recited in claim 1, wherein the test access interface circuitry comprise a selection device configured to select output from at least two sources: a serial output of a boundary scan register for the second side of the logic die and the second input port.

7. The stack of dies recited in claim 1, wherein the memory interface circuitry further comprises:
- a first additional MBSR serial output port, the first additional MBSR serial output port and the MBSR serial input port are serial output/input ports for a first MBSR,
- a first additional MBSR serial input port,
- a second additional MBSR serial output port, the second additional MBSR serial output port and the first additional MBSR serial input port are serial output/input ports for a second MBSR,
- a second additional MBSR serial input port,
- a third additional MBSR serial output port, the third additional MBSR serial output port and the second additional MBSR serial input port are serial output/input ports for a third MBSR, and
- a third additional MBSR serial input port, the MBSR serial output port and the third additional MBSR serial input port are serial output/input ports for a fourth MBSR;

and wherein the test access interface circuitry further comprises:
- a first additional input port at the second side of the logic die being connected to the first additional MBSR serial output port,
- a first additional output port at the second side of the logic die being connected to the first additional MBSR serial input port, wherein there is a data signal path within the logic die between the first additional input port and the first additional output port,
- a second additional input port at the second side of the logic die being connected to the second additional MBSR serial output port,
- a second additional output port at the second side of the logic die being connected to the second additional MBSR serial input port, wherein there is a data signal path within the logic die between the second additional input port and the second additional output port, a third additional input port at the second side of the logic die being connected to the third additional MBSR serial output port, and
- a third additional output port at the second side of the logic die being connected to the third additional MBSR serial input port, wherein there is a data signal path within the logic die between the third additional input port and the third additional output port.

8. The stack of dies recited in claim 7, wherein the test access interface circuitry further comprises logic for selecting one or more of the first MBSR, the second MBSR, the third MBSR, and the fourth MBSR as one boundary scan register to test corresponding interconnections.

9. The stack of dies recited in claim 1, further comprising:
another logic die, comprising:
- a first input port of the another logic die configured to receive test stimuli and test control instructions;
- a first output port of the another logic die configured to send test responses, test stimuli and test control instructions, the first input port of the another logic die and the first output port of the another logic die being located at a first side of the another logic die, wherein there is a data signal path within the another logic die between the first input port of the another logic die and the first output port of the another logic die;
- a second input port of the another logic die being connected to the first output of the logic die, wherein there is a data signal path within the another logic die between the second input port of the another logic die and the first output port of the another logic die;
- a second output port of the another logic die being connected to the first input of the logic die, the second input port of the another logic die and the second output port of the another logic die being located at a second side of the another logic die, wherein there is a data signal path within the another logic die between the first input port of the another logic die and the second output port of the another logic die; and
- test access interface circuitry of the another logic die, the test access interface circuitry of the another logic die accepting data from either the first input port of the another logic die or the second input port of the another logic die depending on an input selection signal.

10. The stack of dies recited in claim 9, wherein the test access interface circuitry of the logic die can be enabled/disabled by the test access interface circuitry of the another logic die.

11. A method, comprising:
receiving design data of a die; and
modifying the design data of the die, the modifying comprising:
adding a first input port for receiving test stimuli and test control instructions and a first output port for sending test responses, test stimuli and test control instructions, the first input port and the first output port being located at a first side of the die,
providing a data signal path within the die between the first input port and the first output port,
adding a second input port to be connected to a memory boundary scan register output port of a memory die and a second output port to be connected to a memory boundary scan register input port of the memory die, the second input port and the second output port being located at a second side of the die,
providing a data signal path within the die between the second input port and the first output port and a data signal path within the die between the first input port and the second output port, and
adding test access interface circuitry for testing interconnections between the memory die and the die, the test access interface circuitry configured to supply multiple memory boundary scan register control signals to the memory die for testing interconnections, wherein the test access interface circuitry comprises a multiplexer and the test access interface circuitry is configured to use the multiplexer to switch between a test mode and a functional mode, wherein the test mode allows the test stimuli to be transmitted via the second output port to the memory boundary scan register input port.

12. A non-transitory computer-readable medium having stored thereon instructions which, when executed on one or more processors, causes the one or more processors to perform a method of claim 11.

13. The method recited in claim 11, further comprising:
adding multiple memory boundary scan register control signal output ports to be connected to multiple memory boundary scan register input ports of the memory die; and
wherein the test access interface circuitry is configured to supply the multiple memory boundary scan register control signals to the multiple memory boundary scan register control signal output ports.

14. A method of testing a stack of dies comprising a logic die and a memory die stacked on top of the logic die, the method comprising: enabling test access interface circuitry of the logic die; sending a test control instruction to the test access interface circuitry of the logic die to configure the logic die and the memory die for interconnection testing, wherein configuring the logic die and the memory die for interconnection testing comprises sending a signal to enable interconnection testing to a multiplexer of the test access interface circuitry of the logic die, wherein sending the signal to the multiplexer allows test stimuli to be transmitted using a signal path that connects a boundary scan register of the logic die and a boundary scan register of the memory die in series; and loading the test stimuli using the signal path that connects the boundary scan register of the logic die and the boundary scan register of the memory die in series.

15. The method recited in claim 14, wherein the test access interface circuitry is compatible with IEEE 1149.1.

16. The method recited in claim 14, wherein the test access interface circuitry outputs control signals to the memory die that are compatible with JESD 229, a JEDEC standard.

17. The method recited in claim 14, wherein the test access interface circuitry of the logic die is enabled by test access interface circuitry of another logic die stacked under the logic die.

18. The method recited in claim 14, wherein a plurality of memory boundary scan register control signals are sent from the test access interface circuitry of the logic die to a plurality of memory boundary scan register control signal output ports of the logic die connected to a plurality of memory boundary scan register control signal input ports of the memory die.

* * * * *